(12) United States Patent
Sato et al.

(10) Patent No.: US 11,456,325 B2
(45) Date of Patent: Sep. 27, 2022

(54) IMAGING DEVICE, METHOD FOR MANUFACTURING IMAGING DEVICE, AND ELECTRONIC DEVICE

(71) Applicant: SONY SEMICONDUCTOR SOLUTIONS CORPORATION, Kanagawa (JP)

(72) Inventors: Naoyuki Sato, Kanagawa (JP); Eriko Ohtsu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/177,877

(22) Filed: Feb. 17, 2021

(65) Prior Publication Data

US 2021/0183932 A1 Jun. 17, 2021

Related U.S. Application Data

(63) Continuation of application No. 16/313,219, filed as application No. PCT/JP2017/024414 on Jul. 4, 2017, now Pat. No. 10,950,643.

(30) Foreign Application Priority Data

Jul. 6, 2016 (JP) .................................. 2016-133965

(51) Int. Cl.
*H01L 27/146* (2006.01)
*H04N 5/374* (2011.01)
(Continued)

(52) U.S. Cl.
CPC ...... *H01L 27/14623* (2013.01); *H01L 27/146* (2013.01); *H01L 27/1464* (2013.01);
(Continued)

(58) Field of Classification Search
None
See application file for complete search history.

(56) References Cited

U.S. PATENT DOCUMENTS

| 10,950,643 B2 | 3/2021 | Sato et al. |
| 2002/0008080 A1 | 1/2002 | Song et al. |

(Continued)

FOREIGN PATENT DOCUMENTS

| JP | H10-189936 | 7/1998 |
| JP | 2000-340553 | 12/2000 |

(Continued)

OTHER PUBLICATIONS

International Search Report prepared by the Japan Patent Office dated Sep. 20, 2017, for International Application No. PCT/JP2017/024414.

(Continued)

*Primary Examiner* — Khaja Ahmad
(74) *Attorney, Agent, or Firm* — Sheridan Ross P.C.

(57) ABSTRACT

The present disclosure relates to an imaging device, a method for manufacturing an imaging device, and an electronic device capable of reducing light entering an electric-charge holding unit in a back-illuminated imaging device. An imaging device includes: a photoelectric conversion unit; an electric-charge holding unit; a semiconductor substrate; a wiring layer; an insulation film layer; a first light-shielding film; and a second light-shielding film. The insulation film layer, the first light-shielding film, and the wiring layer are stacked on a second surface of the semiconductor substrate. The second light-shielding film includes: a first light-shielding portion extending from the first surface of the semiconductor substrate to a middle of the semiconductor substrate; a second light-shielding portion penetrating the semiconductor substrate; and a third light-shielding portion covering a part of the first surface of the semiconductor substrate. The (Continued)

present technology is applicable to a CMOS image sensor, for example.

20 Claims, 21 Drawing Sheets

(51) Int. Cl.
*H04N 5/359* (2011.01)
*H04N 5/3745* (2011.01)

(52) U.S. Cl.
CPC .. *H01L 27/14636* (2013.01); *H01L 27/14643* (2013.01); *H01L 27/14685* (2013.01); *H01L 27/14689* (2013.01); *H04N 5/359* (2013.01); *H04N 5/374* (2013.01); *H04N 5/3745* (2013.01)

(56) References Cited

U.S. PATENT DOCUMENTS

| | | | |
|---|---|---|---|
| 2011/0216212 A1* | 9/2011 | Watanabe | H04N 5/3575 257/292 |
| 2012/0202309 A1 | 8/2012 | Kondo et al. | |
| 2013/0070131 A1 | 3/2013 | Ohkubo et al. | |
| 2014/0263962 A1 | 9/2014 | Ahn | |
| 2015/0028405 A1* | 1/2015 | Minami | H01L 27/1463 257/432 |
| 2015/0124140 A1* | 5/2015 | Ohkubo | H01L 27/14629 438/69 |
| 2015/0155327 A1* | 6/2015 | Kuboi | H01L 27/1464 257/292 |
| 2016/0049430 A1* | 2/2016 | Nomura | H01L 27/1463 257/432 |
| 2021/0183932 A1 | 6/2021 | Sato | |
| 2021/0183933 A1 | 6/2021 | Sato et al. | |

FOREIGN PATENT DOCUMENTS

| | | |
|---|---|---|
| JP | 2004-228407 | 8/2004 |
| JP | 2011187544 A | 9/2011 |
| JP | 2012164942 A | 8/2012 |
| JP | 2013-065688 | 4/2013 |
| JP | 2015-023259 | 2/2015 |
| JP | 2015-026708 | 2/2015 |
| JP | 2015082592 A | 4/2015 |
| JP | 2015106621 A | 6/2015 |
| JP | 2016066766 A | 4/2016 |
| KR | 20000067571 A | 11/2000 |
| KR | 100290852 B1 | 5/2001 |
| WO | WO-2014156933 A1 * | 10/2014 ....... H01L 27/14603 |

OTHER PUBLICATIONS

Extended European Search Report for European Patent Application No. 17824217.8, dated Jul. 11, 2019, 5 pages.
Official Action for U.S. Appl. No. 16/313,219, dated Dec. 13, 2019, 11 pages. Restriction Requirement.
Official Action for U.S. Appl. No. 16/313,219, dated Mar. 13, 2020, 13 pages.
Official Action for U.S. Appl. No. 16/313,219, dated Jul. 21, 2020, 14 pages.
Notice of Allowance for U.S. Appl. No. 16/313,219, dated Nov. 19, 2020, 10 pages.

* cited by examiner

IMAGING DEVICE, METHOD FOR MANUFACTURING IMAGING DEVICE, AND ELECTRONIC DEVICE

CROSS REFERENCE TO RELATED APPLICATIONS

This application is a continuation of U.S. patent application Ser. No. 16/313,219, filed Dec. 26, 2018, which is a national stage application under 35 U.S.C. 371 and claims the benefit of PCT Application No. PCT/JP2017/024414 having an international filing date of 4 Jul. 2017, which designated the United States, which PCT application claimed the benefit of Japanese Patent Application No. 2016-133965 filed 6 Jul. 2016, the entire disclosures of each of which are incorporated herein by reference.

TECHNICAL FIELD

The technology according to the present disclosure relates to an imaging device, a method for manufacturing an imaging device, and an electronic device, and particularly relates to a back-illuminated imaging device including an electric-charge holding unit, a method for manufacturing the imaging device, and an electronic device including the imaging device.

BACKGROUND ART

In a back-illuminated CMOS image sensor having a global shutter function, an electric-charge holding unit is provided in a semiconductor substrate. The electric-charge holding unit temporarily holds electric charge generated by a photoelectric conversion unit. In a case where light enters the electric-charge holding unit, unnecessary electric charge is generated. Accordingly, optical noise is generated, deteriorating image quality. In view of the circumstances, a study has been conventionally conducted to reduce light entering the electric-charge holding unit.

For example, PTL 1 discloses a first embodiment in which among the surfaces of an electric-charge holding unit, the top surface and the bottom surface are covered by light shielding films. The top surface of the electric-charge holding unit is at the incident-surface side of a semiconductor substrate from which light enters. The bottom surface is opposite to the top surface. This configuration prevents not only light entering from the incident surface side of the semiconductor substrate but also light reflected off a wiring layer stacked on the surface opposite to the incident surface of the semiconductor substrate from entering the electric-charge holding unit.

Further, PTL 1 discloses a second embodiment in which the light shielding film covers the top surface and the side surfaces of the electric-charge holding unit and a part of the light shielding film on the side surfaces penetrates the semiconductor substrate. This configuration allows blocking of light that would otherwise enter the side surfaces of the electric-charge holding unit in a more reliable manner.

CITATION LIST

Patent Literature

[PTL 1]
Japanese Patent Laid-Open No. 2013-65688

SUMMARY

Technical Problems

However, in the first embodiment of PTL 1, the light shielding film covering the side surfaces of the electric-charge holding unit only lies until the middle of the semiconductor substrate. Therefore, it is not possible to prevent light entering from part of the side surfaces that are not covered by the light shielding film.

Further, in the second embodiment of PTL 1, the bottom surface of the electric-charge holding unit is not covered by the light shielding film. Therefore, it is not possible to prevent light reflected off the wiring layer from entering the electric-charge holding unit.

In view of the foregoing, the technology according to the present disclosure (hereinafter also simply referred to as present technology) enables to reduce light entering an electric-charge holding unit in a back-illuminated imaging device including the electric-charge holding unit.

Solution to Problems

An imaging device according to a first aspect of the present technology includes: a photoelectric conversion unit; an electric-charge holding unit configured to hold an electric charge generated by the photoelectric conversion unit; a semiconductor substrate in which the photoelectric conversion unit and the electric-charge holding unit are formed; a wiring layer; an insulation film layer; a first light-shielding film; and a second light-shielding film. The insulation film layer, the first light-shielding film, and the wiring layer are stacked on a second surface of the semiconductor substrate in order from closest to the second surface, the second surface being opposite to a first surface of the semiconductor substrate, the first surface being at a light receiving side of the semiconductor substrate. The second light-shielding film includes: a first light-shielding portion arranged between the photoelectric conversion unit and the electric-charge holding unit and extending from the first surface of the semiconductor substrate to a middle of the semiconductor substrate; a second light-shielding portion arranged between the photoelectric conversion unit and the electric-charge holding unit and penetrating the semiconductor substrate; and a third light-shielding portion covering a part of the first surface of the semiconductor substrate.

The first light-shielding portion and the second light-shielding portion can be coupled to each other in a direction parallel to the first surface.

Side surfaces of the photoelectric conversion unit can be surrounded by the first light-shielding portion and the second light-shielding portion.

The first light-shielding portion can be at least arranged between the photoelectric conversion unit and a transfer gate portion configured to transfer the electric charge from the photoelectric conversion unit to the electric-charge holding unit. The second light-shielding portion can be at least arranged between the photoelectric conversion unit and the electric-charge holding unit that are arranged in mutually different pixels.

The insulation film layer can include two layers including a first insulation film and a second insulation film that are different from each other in composition. The first insulation film can be arranged between the second surface of the semiconductor substrate and the second insulation film.

The first insulation film can be an oxide film. The second insulation film can be a nitride film or an oxynitride film.

The insulation film layer can further include a third insulation film arranged between the second insulation film and the first light-shielding film and including an oxide film.

The first insulation film can have a thickness of 10 nm or greater. The second insulation film can have a thickness of 50 nm or greater. The third insulation film can have a thickness of 25 nm or greater.

The first insulation film can have a thickness in a range of 10 to 20 nm. The second insulation film can have a thickness in a range of 50 to 100 nm. The third insulation film can have a thickness in a range of 30 to 100 nm.

The second light-shielding portion can penetrate the first insulation film and extend into the second insulation film.

The second light-shielding portion can penetrate the insulation film layer and can be coupled to the first light-shielding film.

The third light-shielding portion can cover a region of the first surface of the semiconductor substrate, the region excluding a region from which light enters the photoelectric conversion unit.

The first light-shielding film can entirely cover a surface of the photoelectric conversion unit, the surface being opposite to a light receiving surface of the photoelectric conversion unit.

A positive bias or a negative bias can be applied to the second light-shielding portion.

The second light-shielding portion can be greater in width in a direction parallel to the first surface than the first light-shielding portion.

A method for manufacturing an imaging device according to a second aspect of the present technology includes: a first step of forming a first trench and a second trench in respective predetermined positions on a first pattern between a photoelectric conversion unit and an electric-charge holding unit configured to hold an electric charge generated by the photoelectric conversion unit, the first pattern covering a first surface of a semiconductor substrate in which the photoelectric conversion unit and the electric-charge holding unit are formed, the first surface being at a light receiving side of the semiconductor substrate; a second step of filling the first trench with a second pattern; a third step of digging the second trench down to a middle of the semiconductor substrate; a fourth step of, after removing the second pattern, digging down the first trench and the second trench until the second trench penetrates the semiconductor substrate and reaches an insulation film layer formed on a second surface of the semiconductor substrate opposite to the first surface of the semiconductor substrate; a fifth step of forming a multi-layer film so as to cover the first surface of the semiconductor substrate, inner walls and a bottom of the first trench, and inner walls and a bottom of the second trench, the multi-layer film including a fixed electric charge film, an anti-reflection film, and an insulation film; a sixth step of filling the first trench with a third pattern; a seventh step of, while removing the third pattern, digging the second trench down until the second trench penetrates the multi-layer film and the insulation film layer and reaches a first light-shielding film stacked on the insulation film layer; and an eighth step of forming a second light-shielding film in the first trench and the second trench.

The insulation film layer can include two layers including a first insulation film and a second insulation film that are different from each other in composition.

In the fourth step, the second trench can be caused to penetrate the semiconductor substrate and the first insulation film to the second insulation film.

The insulation film layer can include a third insulation film arranged between the second insulation film and the first light-shielding film. The first insulation film and the third insulation film each can be an oxide film. The second insulation film can be a nitride film or an oxynitride film.

Before the first step, a ninth step, a tenth step, and an eleventh step can be further included. In the ninth step, the second insulation film can be formed on a surface of the first insulation film, the surface being opposite to the second surface of the semiconductor substrate. In the tenth step, a third trench can be formed in a position for forming the second trench in the second insulation film, the third trench penetrating to the first insulation film. In the eleventh step, the third insulation film can be deposited on a surface of the second insulation film while the third trench is filled with the third insulation film. In the seventh step, the third insulation film in the third trench can be removed and the second trench can be dug down to the first light-shielding film.

A method for manufacturing an imaging device according to a third aspect of the present technology includes: a first step of forming a first trench and a second trench in respective predetermined positions on a first pattern between a photoelectric conversion unit and an electric-charge holding unit configured to hold an electric charge generated by the photoelectric conversion unit, the first pattern covering a first surface of a semiconductor substrate in which the photoelectric conversion unit and the electric-charge holding unit are formed, the first surface being at a light receiving side of the semiconductor substrate; a second step of filling the first trench with a second pattern; a third step of digging the second trench down to a middle of the semiconductor substrate; a fourth step of, after removing the second pattern, digging down the first trench and the second trench until the second trench penetrates the semiconductor substrate and reaches an insulation film layer formed on a second surface of the semiconductor substrate opposite to the first surface of the semiconductor substrate; and a fifth step of forming a light shielding film in the first trench and the second trench.

An electronic device according to a fourth aspect of the present technology includes: an imaging device; and a signal processing unit configured to process a signal output from the imaging device. The imaging device includes: a photoelectric conversion unit; an electric-charge holding unit configured to hold an electric charge generated by the photoelectric conversion unit; a semiconductor substrate in which the photoelectric conversion unit and the electric-charge holding unit are formed; a wiring layer; an insulation film layer; a first light-shielding film; and a second light-shielding film. The insulation film layer, the first light-shielding film, and the wiring layer are stacked on a second surface of the semiconductor substrate in order from closest to the second surface, the second surface being opposite to a first surface of the semiconductor substrate, the first surface being at a light receiving side of the semiconductor substrate. The second light-shielding film includes: a first light-shielding portion arranged between the photoelectric conversion unit and the electric-charge holding unit and extending from the first surface of the semiconductor substrate to a middle of the semiconductor substrate; a second light-shielding portion arranged between the photoelectric conversion unit and the electric-charge holding unit and penetrating the semiconductor substrate; and a third light-shielding portion covering a part of the first surface of the semiconductor substrate.

In the first aspect or the fourth aspect of the present technology, the first light-shielding film and the first to third light-shielding portions of the second light-shielding film block light.

In the second aspect of the present technology, the first trench and the second trench are formed in the respective predetermined positions on the first pattern between the photoelectric conversion unit and the electric-charge holding unit configured to hold the electric charge generated by the photoelectric conversion unit. The first pattern covers the first surface of the semiconductor substrate in which the photoelectric conversion unit and the electric-charge holding unit are formed. The first surface is at the light receiving side of the semiconductor substrate. The first trench is filled with the second pattern. The second trench is dug down to the middle of the semiconductor substrate. After the second pattern is removed, the first trench and the second trench are dug down until the second trench penetrates the semiconductor substrate and reaches the insulation film layer formed on the second surface of the semiconductor substrate opposite to the first surface of the semiconductor substrate. The multi-layer film is formed so as to cover the first surface of the semiconductor substrate, the inner walls and the bottom of the first trench, and the inner walls and the bottom of the second trench. The multi-layer film includes the fixed electric charge film, the anti-reflection film, and the insulation film. The first trench is filled with the third pattern. While the third pattern is removed, the second trench is dug down until the second trench penetrates the multi-layer film and the insulation film layer and reaches the first light-shielding film stacked on the insulation film layer. The second light-shielding film is formed in the first trench and the second trench.

In the third aspect of the present technology, the first trench and the second trench are formed in the respective predetermined positions on the first pattern between the photoelectric conversion unit and the electric-charge holding unit configured to hold the electric charge generated by the photoelectric conversion unit. The first pattern covers the first surface of the semiconductor substrate in which the photoelectric conversion unit and the electric-charge holding unit are formed. The first surface is at the light receiving side of the semiconductor substrate. The first trench is filled with the second pattern. The second trench is dug down to the middle of the semiconductor substrate. After the second pattern is removed, the first trench and the second trench are dug down until the second trench penetrates the semiconductor substrate and reaches the insulation film layer formed on the second surface of the semiconductor substrate opposite to the first surface of the semiconductor substrate. The light shielding film is formed in the first trench and the second trench.

Advantageous Effect of Invention

According to the first aspect or the fourth aspect of the present technology, it is possible to reduce light entering an electric-charge holding unit in a back-illuminated imaging device including the electric-charge holding unit.

According to the second aspect or the third aspect of the present technology, it is possible to form a light shielding film between a photoelectric conversion unit and an electric-charge holding unit in a semiconductor substrate in a back-illuminated imaging device including the electric-charge holding unit. A part of the light shielding film penetrates the semiconductor substrate. As a result, it is possible to reduce light entering the electric-charge holding unit.

It is noted that the effects described herein are not necessarily limitative, and any of the effects described in the present disclosure may be exhibited.

DESCRIPTION OF EMBODIMENTS

Figure 1:
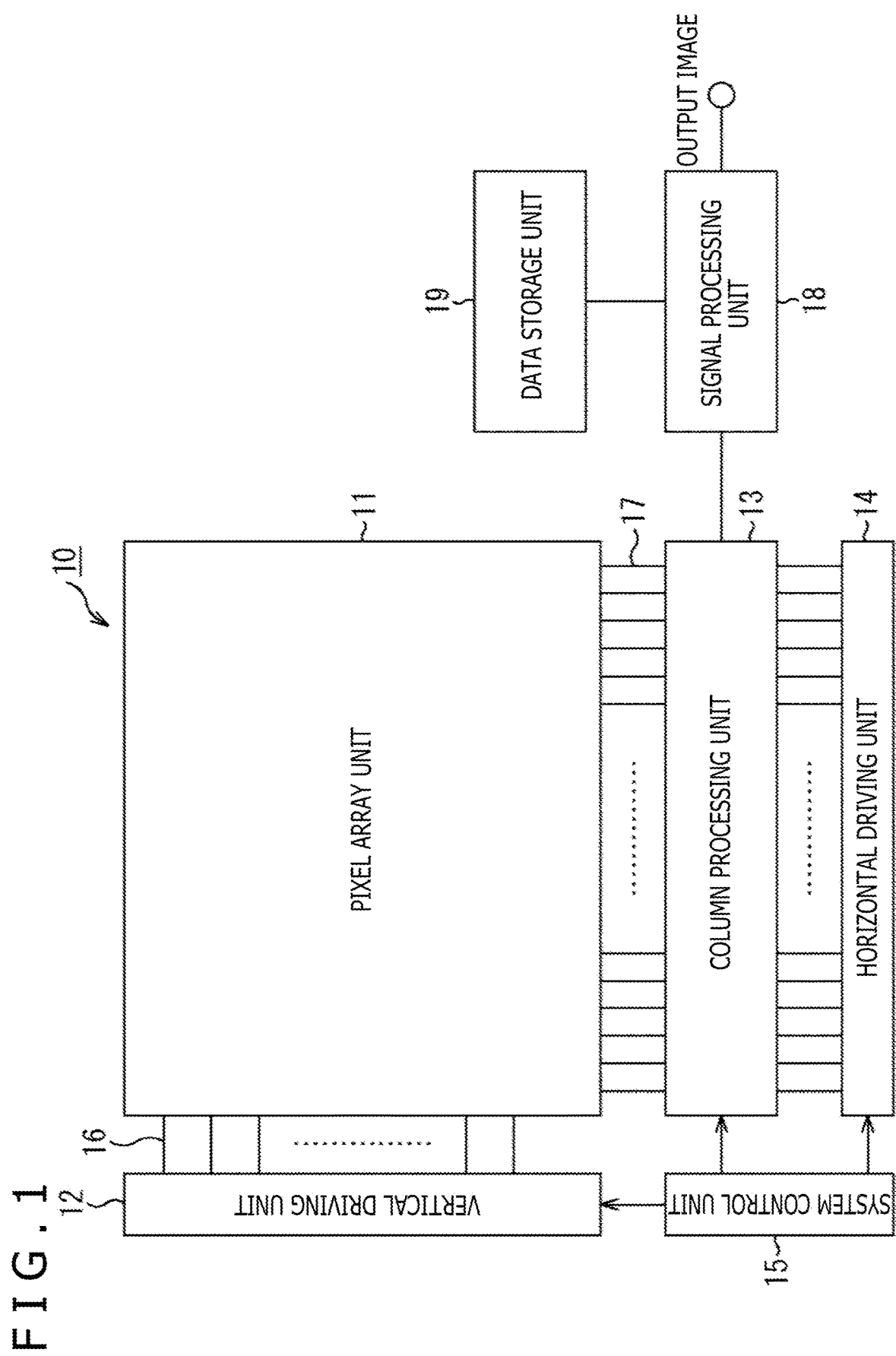
FIG. 1 is a diagram illustrating an exemplary configuration of a CMOS image sensor to which the present technology is applied.

Hereinafter, modes for carrying out the invention (hereinafter referred to as "embodiments") will be described in detail with reference to the drawings. It is noted that description will be made in the following order.
1. First Embodiment
2. Second Embodiment
3. Modification
4. Application Examples 1. First Embodiment First, the first embodiment of the present technology will be described with reference to FIGS. 1 to 12.
<1-1 Exemplary Configuration of CMOS Image Sensor>
FIG. 1 is a block diagram illustrating an exemplary configuration of a CMOS (Complementary Metal Oxide Semiconductor) image sensor serving as an imaging device to which the present technology is applied.

A CMOS image sensor 10 includes a pixel array unit 11, a vertical driving unit 12, a column processing unit 13, a horizontal driving unit 14, and a system control unit 15. The pixel array unit 11, the vertical driving unit 12, the column processing unit 13, the horizontal driving unit 14, and the system control unit 15 are formed on a semiconductor substrate (chip), not illustrated.

In the pixel array unit 11, unit pixels are arranged in a two-dimensional matrix. Each of the unit pixels (a unit pixel 50 in FIG. 2) includes a photoelectric conversion device. The photoelectric conversion device generates photocharge having the amount of electric charge in proportion to the amount of incident light, and accumulates the photocharge inside the photoelectric conversion device. It is noted that hereinafter, photocharge having the amount of electric charge in proportion to the amount of incident light will be occasionally simply referred to as "electric charge," and the unit pixels may be occasionally simply referred to as "pixels."

In the pixel array unit 11, moreover, pixel drive lines 16 and vertical signal lines 17 are formed with respect to the pixel array in a matrix. The pixel drive lines 16 are formed along a horizontal direction of the figure (in a direction in which pixels in the pixel rows are arranged). The vertical signal lines 17 are formed along a vertical direction of the figure (in a direction in which pixels in the pixel columns are arranged). Each of the pixel drive lines 16 is formed for each row. Each of the vertical signal lines 17 is formed for each column. One end of each of the pixel drive lines 16 is coupled to a corresponding one of output ends of the vertical driving unit 12. The output ends of the vertical driving unit 12 individually correspond to the rows of the pixel array unit 11.

In addition, the CMOS image sensor 10 includes a signal processing unit 18 and a data storage unit 19. The signal processing unit 18 and the data storage unit 19 may be processed by an external signal processing unit such as a DSP (Digital Signal Processor) or software provided on a substrate different from the CMOS image sensor 10. Alternatively, the signal processing unit 18 and the data storage unit 19 may be mounted on the same substrate as the CMOS image sensor 10.

The vertical driving unit 12 includes a shift register, an address decoder, or the like. The vertical driving unit 12 functions as a pixel driving unit that drives all the pixels of the pixel array unit 11 at the same time or drives the pixels on a row-by-row basis, for example. Although the specific configuration of the vertical driving unit 12 is not illustrated in the drawings, the vertical driving unit 12 includes a read scanning system and a sweeping scanning system, or bulk sweeping and bulk transfer.

The read scanning system sequentially selects and scans the unit pixels of the pixel array unit 11 on a row-by-row basis to read signals from the unit pixels. In the case of row driving (rolling shutter operation), the sweeping scanning is performed the time of shutter speed earlier than the read scanning on the row to be read and scanned by the read scanning system. Further, in the case of global exposure (global shutter operation), the bulk sweeping is performed the time of shutter speed earlier than the bulk transfer.

Through this sweeping, unnecessary electric charge is swept (reset) out of the photoelectric conversion devices of the unit pixels in the row to be read. Sweeping (resetting) the unnecessary electric charge then leads to what is called electronic shutter operation. The electronic shutter operation herein refers to the operation of discarding photocharge of the photoelectric conversion devices and starting a new exposure (starting accumulation of photocharge).

The signals read by the read scanning system through the reading operation are proportional to the amount of light that has been entered following the previous reading operation or the electronic shutter operation. In the case of row driving, the photocharge accumulation period (exposure period) in the unit pixels is from the timing at which the signals were read through the previous reading operation or the timing at which the signals were swept through the electronic shutter operation to the timing at which the signals are read through the reading operation this time. In the case of global exposure, the accumulation period (exposure period) is from bulk sweeping to bulk transfer.

The pixel signals output from the unit pixels in the pixel row selected and scanned by the vertical driving unit 12 are supplied to the column processing unit 13 through the respective vertical signal lines 17. For each pixel column of the pixel array unit 11, the column processing unit 13 performs predetermined signal processing on the pixel signal output from the unit pixel in the selected row through the corresponding vertical signal line 17. The column processing unit 13 also temporarily stores the pixel signals that have been processed.

Specifically, the column processing unit 13 at least performs noise removal processing as signal processing, such as CDS (Correlated Double Sampling) processing. The correlated double sampling performed by the column processing unit 13 removes reset noise and pixel-specific fixed pattern noise such as variations in thresholds of amplification transistors. It is noted that in addition to the noise removal processing, for example, the column processing unit 13 may have an AD (analog-digital) conversion function to output signal levels as digital signals.

The horizontal driving unit 14 includes a shift register, an address decoder, or the like. The horizontal driving unit 14 sequentially selects a unit circuit of the column processing unit 13 that corresponds to each of the pixel columns. Through the selection and scanning by the horizontal driving unit 14, the pixel signals processed by the column processing unit 13 are sequentially output to the signal processing unit 18.

The system control unit 15 includes a timing generator and the like. The timing generator generates various timing signals. On the basis of the various timing signals generated by the timing generator, the system control unit 15 controls driving of the vertical driving unit 12, the column processing unit 13, the horizontal driving unit 14, and the like.

The signal processing unit 18 at least includes an addition processing function. The signal processing unit 18 performs various signal processing such as addition processing on the pixel signals output from the column processing unit 13. The data storage unit 19 temporarily stores data necessary for the signal processing performed by the signal processing unit 18.

<1-2. Exemplary Configuration of Pixels>

Next, description will be made with regard to the specific structure of the unit pixels 50 arranged in the matrix in the pixel array unit 11 illustrated in FIG. 1.

Figure 2:
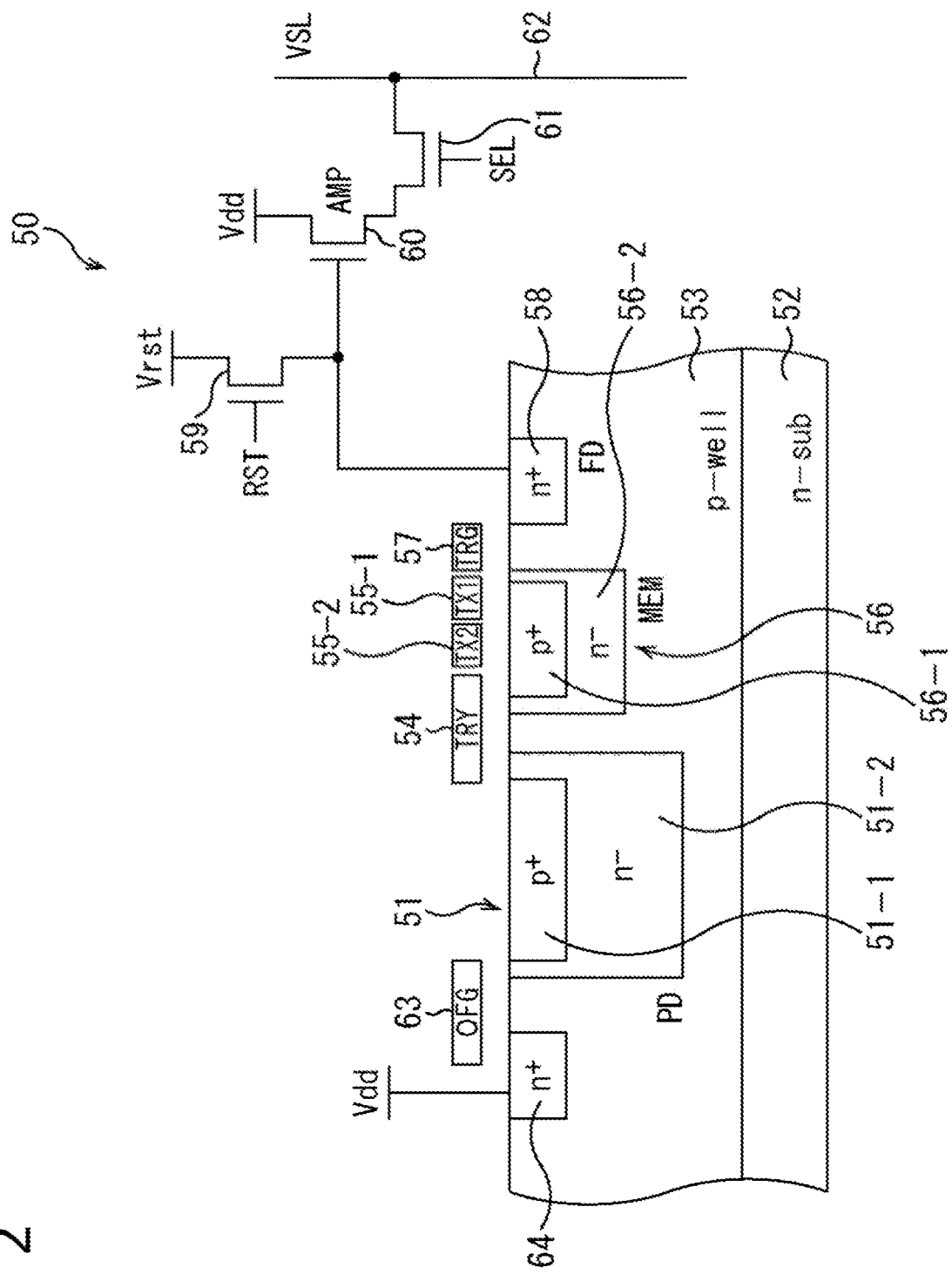
FIG. 2 is a circuit diagram illustrating an exemplary configuration of a unit pixel of the CMOS image sensor illustrated in FIG. 1.

FIG. 2 illustrates an exemplary configuration of a unit pixel. The unit pixel 50 includes a photodiode (PD) 51. The photodiode 51 functions as the photoelectric conversion device. The photodiode 51 is, for example, a buried photodiode. The photodiode 51 is formed by forming a p-type layer 51-1 on a surface of the substrate and burying an n-type buried layer 51-2 in a p-type well layer 53 formed on an n-type substrate 52. It is noted that impurity concentration of the n-type buried layer 51-2 causes depletion at the time of discharge of electric charge.

In addition to the photodiode 51, the unit pixel 50 also includes a TRY gate 54, a TX1 gate 55-1, a TX2 gate 55-2, and an electric-charge holding unit (MEM) 56. The TRY gate 54 is arranged at a position connectable to the photodiode 51 and the electric-charge holding unit 56. Further, the TX1 gate 55-1 and the TX2 gate 55-2 are arranged in the vicinity of the electric-charge holding unit 56. In the unit pixel 50, in addition, the electric-charge holding unit 56 is formed by a buried n-type diffusion region 56-2. The electric-charge holding unit 56 includes, as the surface thereof, a p-type layer 56-1.

Even with the electric-charge holding unit 56 formed by the n-type diffusion region 56-2, it is possible to obtain a similar effect to the electric-charge holding unit 56 formed by a buried channel. Specifically, the n-type diffusion region 56-2 is formed inside the p-type well layer 53, and the p-type layer 56-1 is formed on the surface of the substrate. This configuration prevents dark current generated at the Si—SiO2 interface from being accumulated in the n-type diffusion region 56-2 of the electric-charge holding unit 56. This leads to an improvement in image quality.

Applying a driving signal TRY to a gate electrode causes the TRY gate 54 to transfer the electric charge, which has been converted from light by the photodiode 51 and accumulated inside the photodiode 51, to the electric-charge holding unit 56. Further, the TRY gate 54 functions as a gate to prevent the electric charge from flowing back from the electric-charge holding unit 56 to the photodiode 51.

The TX2 gate 55-2 functions as a gate to transfer the electric charge from the photodiode 51 to the electric-charge holding unit 56. The TX2 gate 55-2 also functions as a gate to cause the electric-charge holding unit 56 to hold the electric charge.

The TX1 gate 55-1 functions as a gate to transfer the electric charge from the electric-charge holding unit 56 to an FD (Floating Diffusion) region 58. The TX1 gate 55-1 also functions as a gate to cause the electric-charge holding unit 56 to hold the electric charge.

As for the electric-charge holding unit 56, when a driving signal TX2 and a driving signal TX1 are applied to a gate electrode of the TX2 gate 55-2 and a gate electrode of the TX1 gate 55-1, respectively, modulation is applied to the electric-charge holding unit 56. In other words, applying the driving signal TX2 and the driving signal TX1 to the gate electrode of the TX2 gate 55-2 and the gate electrode of the TX1 gate 55-1, respectively, deepens the potential of the electric-charge holding unit 56. This leads to increased saturation capacity of the electric-charge holding unit 56, compared to the electric-charge holding unit 56 to which modulation is not applied.

The unit pixel 50 also includes a TRG gate 57 and the floating diffusion region 58. Applying a driving signal TRG to a gate electrode of the TRG gate 57 causes the TRG gate 57 to transfer the electric charge accumulated in the electric-charge holding unit 56 to the floating diffusion region 58.

The floating diffusion region 58 functions as an electric charge-voltage conversion unit including an n-type layer. The floating diffusion region 58 converts the electric charge, which has been transferred from the electric-charge holding unit 56 through the TRG gate 57, into voltage.

The unit pixel 50 also includes a reset transistor (RST) 59, an amplification transistor (AMP) 60, and a selection transistor (SEL) 61. It is noted that although FIG. 2 illustrates an example where n-channel MOS transistors are used for the reset transistor 59, the amplification transistor 60, and the selection transistor 61, the combination of the conductivity types of the reset transistor 59, the amplification transistor 60, and the selection transistor 61 is not limited to this combination.

The reset transistor 59 is coupled between a power supply Vrst and the floating diffusion region 58. Applying a driving signal RST to a gate electrode of the reset transistor 59 resets the floating diffusion region 58. A drain electrode of the amplification transistor 60 is coupled to a power supply Vdd, and a gate electrode of the amplification transistor 60 is coupled to the floating diffusion region 58 to read the voltage of the floating diffusion region 58.

For example, a drain electrode of the selection transistor 61 is coupled to a source electrode of the amplification transistor 60, and a source electrode of the selection transistor 61 is coupled to a corresponding one of the vertical signal lines 17. Applying a driving signal SEL to a gate electrode of the selection transistor 61 causes the selection transistor 61 to select the unit pixel 50 from which a pixel signal is read. It is noted that the selection transistor 61 can be coupled between the power supply Vdd and the drain electrode of the amplification transistor 60.

It is noted that one or more of the transistors among the reset transistor 59, the amplification transistor 60, and the selection transistor 61 can be omitted depending on how the pixel signals are read.

Further, although the n-type buried channel is formed in the p-type well layer 53 in the unit pixel 50 in FIG. 2 and in another exemplary configuration of the unit pixel 50 described later, the opposite conduction type may be employed. In this case, all the relations with the potentials described later become opposite.

The unit pixel 50 illustrated in FIG. 2 also includes an overflow gate to prevent blooming. Applying a driving signal OFG to a gate electrode of an OFG gate 63 at the start of the exposure causes the OFG gate 63 to discharge the electric charge in the photodiode 51 to an n-type layer 64. Predetermined voltage Vdd is applied to the n-type layer 64.

The CMOS image sensor 10 configured in this manner performs global shutter operation (global exposure) by starting exposure in all the pixels at the same time, ending exposure in all the pixels at the same time, and transferring the electric charge accumulated in the photodiode 51 to the light-shielded electric-charge holding unit 56. This global shutter operation makes the exposure period the same among all the pixels, resulting in imaging with no distortion.

<1-3. First Embodiment of Light Shielding Structure of CMOS Image Sensor>

Next, the first embodiment of the light shielding structure of the CMOS image sensor 10 will be described with reference to FIGS. 3 to 6. It is noted that hereinafter, the CMOS image sensor 10 having the light shielding structure illustrated in FIGS. 3 to 6 will be referred to as "CMOS image sensor 10a."

Figure 3:
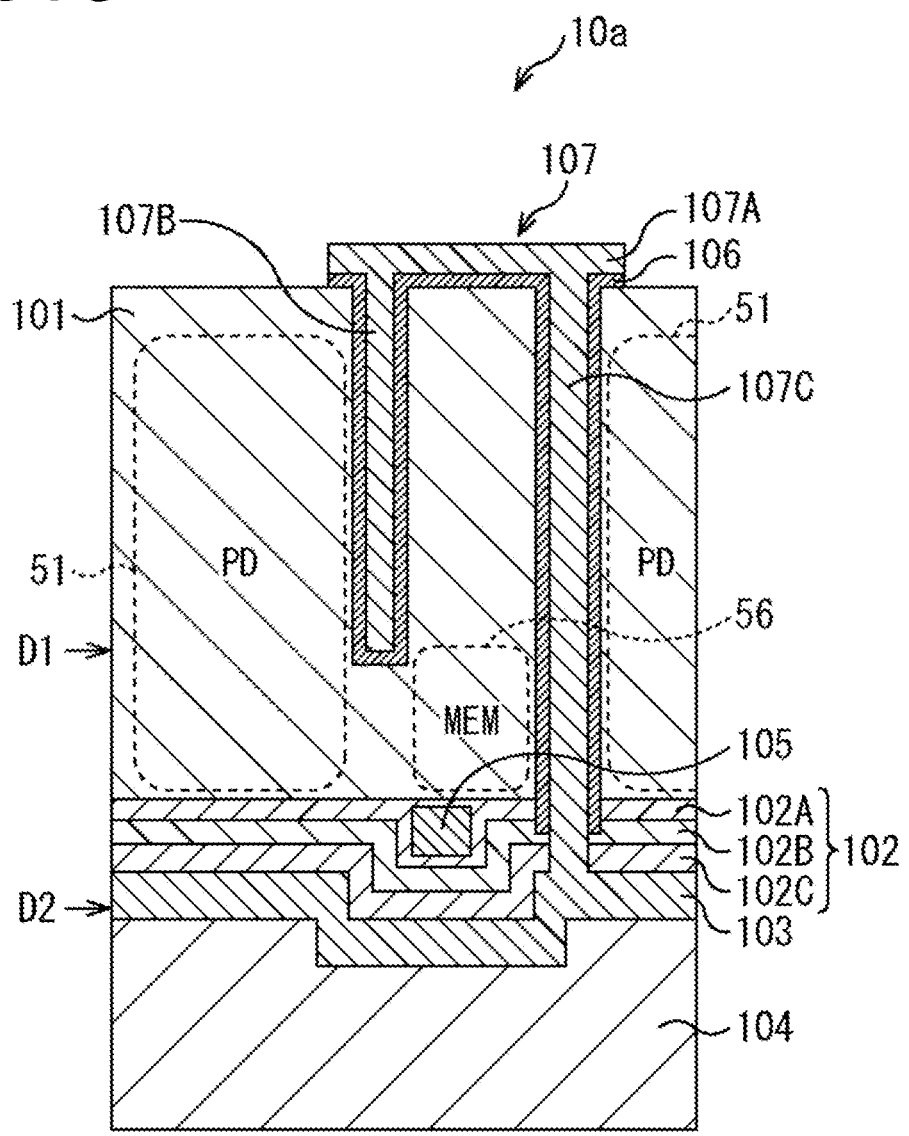
FIG. 3 is a schematic cross-sectional view of a first embodiment of a light shielding structure of the CMOS image sensor illustrated in FIG. 1.

FIG. 3 is a schematic cross-sectional view of the light shielding structure of the CMOS image sensor 10a.

From the top of the figure, a semiconductor substrate 101, an insulation film layer 102, a light shielding film 103, and a wiring layer 104 are stacked in the CMOS image sensor 10a. The CMOS image sensor 10a is a back-illuminated imaging device that irradiates the photodiode 51 with light from the back surface of the semiconductor substrate 101. The back surface of the semiconductor substrate 101 is opposite to the front surface thereof where the wiring layer 104 is stacked.

It is noted that although not illustrated, passivation films, color filters, microlenses, and the like are stacked on the back surface of the semiconductor substrate 101, for example. Further, a supporting substrate is stacked below the wiring layer 104, for example.

It is noted that hereinafter, the back surface of the semiconductor substrate 101 will also be referred to as an incident surface. The surface that is the front surface of the semiconductor substrate 101 and that is arranged at the boundary with the wiring layer 104 will also be referred to as a boundary surface. Further, the surface of the photodiode 51 at the incident-surface side of the semiconductor substrate 101 will be hereinafter referred to as a light receiving surface, and the surface opposite to the light receiving surface will be referred to as a bottom surface. Further, the surface of the electric-charge holding unit 56 at the incident-surface side of the semiconductor substrate 101 will be hereinafter referred to as a top surface, and the surface opposite to the top surface will be referred to as a bottom surface.

The semiconductor substrate 101 includes a silicon substrate, for example. In the semiconductor substrate 101, the photodiode 51 and the electric-charge holding unit 56 are formed. It is noted that the photodiode 51 on the left side of the figure and the electric-charge holding unit 56 are arranged in the same pixel 50, and the photodiode 51 on the right side of the figure and the electric-charge holding unit 56 are arranged in the different pixels 50 adjacent to each other.

The insulation film layer 102 includes three layers of insulation films 102A to 102C. The insulation films 102A to 102C include, for example, oxide films such as SiO2 films. The insulation film 102A also serves as an insulation film between a gate electrode 105 and the semiconductor substrate 101. It is noted that the gate electrode 105 corresponds to, for example, the gate electrode of the TRY gate 54 illustrated in FIG. 2. The insulation film 102B includes, for example, a nitride film such as a SiN film.

The light shielding film 103 includes, for example, a light-shielding metal such as tungsten. The light shielding film 103 prevents the light, which has transmitted the semiconductor substrate 101 without being absorbed by the photodiode 51, from entering the wiring layer 104. This configuration reduces the light entering the wiring layer 104 after transmitting the semiconductor substrate 101, thereby reducing the light entering the electric-charge holding unit 56 after being reflected off the wiring layer 104.

A light shielding film 107 is formed via a multi-layer film 106 on the incident surface of the semiconductor substrate 101 and between the photodiode 51 and the electric-charge holding unit 56.

The multi-layer film 106 includes a film having a three-layer structure including, for example, a fixed electric charge film, an anti-reflection film, and an insulation film. The insulation film includes, for example, an oxide film such as an SiO2 film.

The light shielding film 107 includes, for example, a light-shielding metal such as tungsten. The light shielding film 107 mainly reduces light directly or indirectly entering the electric-charge holding unit 56 after the light enters the incident surface of the semiconductor substrate 101. The light shielding film 107 is largely divided into a surface light-shielding portion 107A, a non-penetrating light shielding portion 107B, and a penetrating light shielding portion 107C.

The surface light-shielding portion 107A covers a region of the incident surface of the semiconductor substrate 101 except a region above the light receiving surface of the photodiode 51. That is, the surface light-shielding portion 107A covers a region of the light receiving surface of the semiconductor substrate 101 except a region from which light enters the photodiode 51.

The non-penetrating light shielding portion 107B extends from the incident surface of the semiconductor substrate 101 to the middle of the semiconductor substrate 101. Further, in this example, the non-penetrating light shielding portion 107B is arranged between the photodiode 51 and the electric-charge holding unit 56 in the same pixel 50.

The penetrating light shielding portion 107C penetrates the semiconductor substrate 101 and the insulation film layer 102 and is coupled to the light shielding film 103. Further, in this example, the penetrating light shielding portion 107C is arranged between the photodiode 51 and the electric-charge holding unit 56 arranged in the different pixels 50.

Here, an example of the thickness of the insulation films 102A to 102C will be described.

The insulation film 102A is set to a thickness of 10 nm or greater, for example. This is a thickness necessary, for example, to process and adjust the depth of a trench for forming the penetrating light shielding portion 107C. The trench penetrates the semiconductor substrate 101. However, since the insulation film 102A also serves as the insulation film between the gate electrode 105 and the semiconductor substrate 101, it is not desirable to make the insulation film 102A too thick. Therefore, the thickness of the insulation film 102A is set within a range of 10 to 20 nm, for example.

The insulation film 102B is set to a thickness of 50 nm or greater, for example. This is a thickness necessary, for example, to process and adjust a contact formed on the wiring layer 104 and to process and control the trench for forming the penetrating light shielding Portion 107C. The trench penetrates the semiconductor substrate 101. For example, this is a thickness necessary to prevent a trench for forming the contact from reaching the semiconductor substrate 101, to prevent the semiconductor substrate 101 from being damaged by the process of the contact, and to make the insulation film 102B stop the trench for forming the penetrating light shielding portion 107C that penetrates the semiconductor substrate 101. However, it is not desirable to make the insulation film 102B too thick in terms of compactness of the CMOS image sensor 10a, for example.

Therefore, the thickness of the insulation film 102B is set within a range of 50 to 100 nm, for example.

The insulation film 102C is set to a thickness of 25 nm or greater, for example. This is a thickness necessary, for example, to prevent the insulation film 102C from being damaged and the insulation film 102B from being exposed when the light shielding film 103 is processed. However, it is not desirable to make the insulation film 102C too thick in terms of compactness of the CMOS image sensor 10a, for example. Therefore, the thickness of the insulation film 102O is set within a range of 30 to 100 nm, for example.

Figure 4:
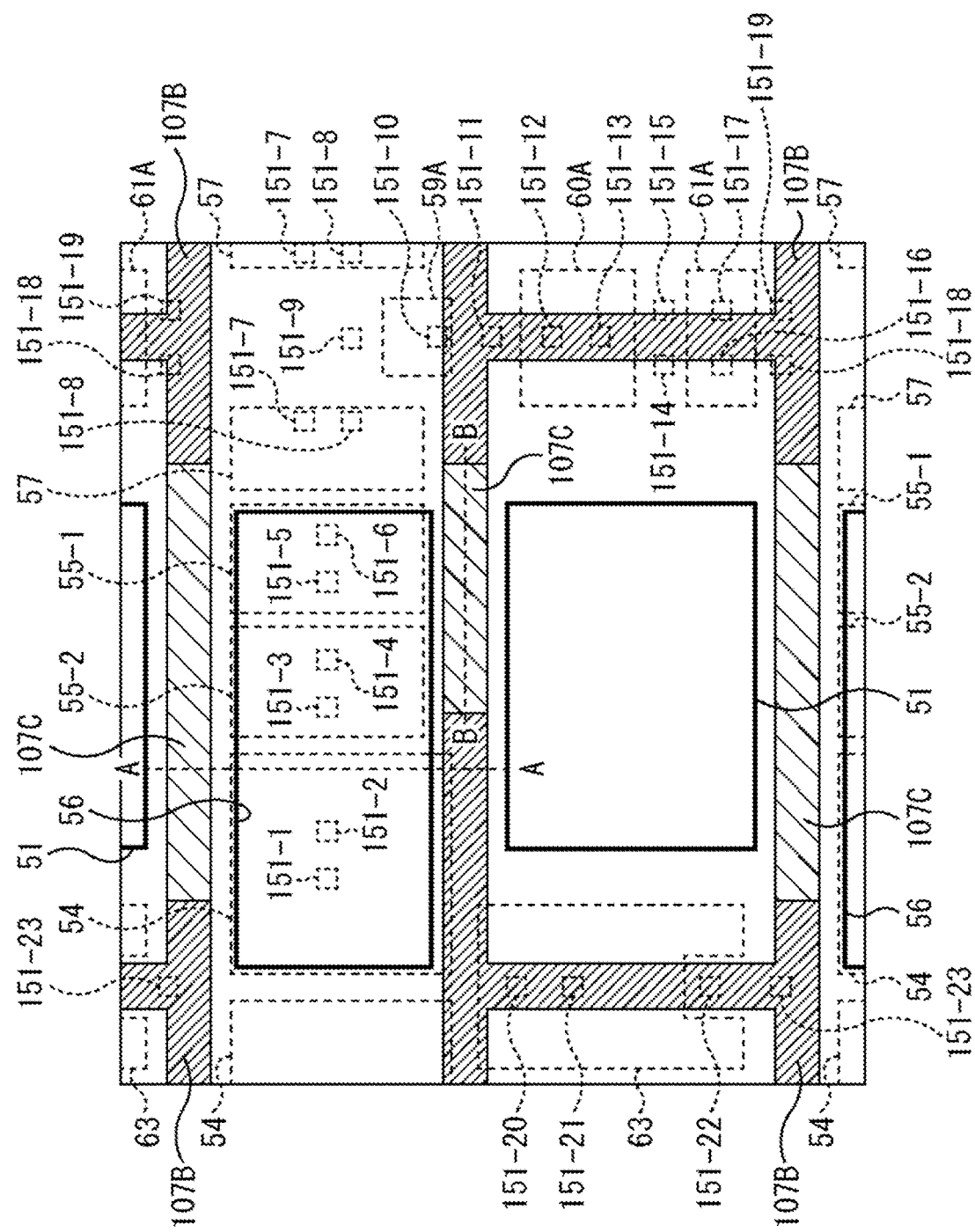
FIG. 4 is a schematic view of arrangement of a light shielding film in a semiconductor substrate with the light shielding structure illustrated in FIG. 3.

FIG. 4 schematically illustrates a planar layout of the cross section of the CMOS image sensor 10a in the vicinity of a depth D1 illustrated in FIG. 3. It is noted that in order to distinguish between the non-penetrating light shielding portion 107B and the penetrating light shielding portion 107C, the non-penetrating light shielding portion 107B is indicated by a narrow diagonal line pattern that is oblique in the right downward direction, while the penetrating light shielding portion 107C is indicated by a wide diagonal line pattern that is oblique in the left downward direction.

Further, the positions of the TRY gate 54, the TX1 gate 55-1, the TX2 gate 55-2, the TRG gate 57, a gate portion 59A of the reset transistor 59, a gate portion 60A of the amplification transistor 60, a gate portion 61A of the selection transistor 61, and the OFG gate 63 formed at the boundary-surface side of the semiconductor substrate 101 are indicated by dotted lines. Further, the positions of contacts 151-1 to 151-23 formed on the wiring layer 104 are indicated by dotted lines.

It is noted that hereinafter, description will be made using the vertical and horizontal directions in FIG. 4 when a positional relation among the units in the pixel 50 is described.

Further, in FIG. 4, one pixel 50 is illustrated in the center, and a part of the surrounding pixel 50 is illustrated. In addition, the respective parts of the pixels 50 are denoted by the same reference sign. It is noted that the units in the pixels 50 horizontally adjacent to each other are arranged symmetrically. Further, the units in the pixels 50 vertically adjacent to each other are arranged similarly to each other.

On the photodiode 51, the TRY gate 54, the TX2 gate 55-2, the TX1 gate 55-1, and the TRG gate 57 are arranged so as to be aligned from left to right. The contact 151-1 and the contact 151-2 are arranged at the substantially center of the TRY gate 54 so as to be aligned horizontally. The contact 151-3 and the contact 151-4 are arranged at the substantially center of the TX2 gate 55-2 so as to be aligned horizontally. The contact 151-5 and the contact 151-6 are arranged at the substantially center of the TX1 gate 55-1 so as to be aligned horizontally. The contacts 151-1 to 151-6 are arranged horizontally in a row. The contact 151-7 and the contact 151-8 are arranged on the right end of the TRG gate 57 so as to be aligned vertically.

Further, the electric-charge holding unit 56 is arranged so as to be substantially overlapped with the TRY gate 54, the TX2 gate 55-2, and the TX1 gate 55-1.

To the right of the photodiode 51, the gate portion 59A of the reset transistor 59, the gate portion 60A of the amplification transistor 60, and the gate portion 61A of the selection transistor 61 are arranged so as to be aligned vertically. The contact 151-9 is arranged above the gate portion 59A. The contact 151-10 is arranged on the lower end of the gate portion 59A. The contact 151-11 is arranged between the gate portion 59A and the gate portion 60A. The contact 151-12 and the contact 151-13 are arranged at the substantially center of the gate portion 60A so as to be aligned vertically. The contacts 151-9 to 151-13 are arranged vertically in a row.

The contact 151-14 and the contact 151-15 are arranged between the gate portion 60A and the gate portion 61A so as to be aligned horizontally. The contact 151-16 and the contact 151-17 are arranged at the substantially center of the gate portion 61A so as to be aligned horizontally. The contact 151-18 and the contact 151-19 are arranged below the gate portion 61A so as to be aligned horizontally. The contact 151-14, the contact 151-16, and the contact 151-18 are arranged vertically in a row. The contact 151-15, the contact 151-17, and the contact 151-19 are arranged vertically in a row.

To the left of the photodiode 51, the OFG gate 63 is arranged. The contact 151-20 and the contact 151-21 are arranged on the upper end of the OFG gate 63 so as to be aligned vertically. The contact 151-22 is arranged in a recessed portion on the lower end of the OFG gate 63. The contact 151-23 is arranged below the OFG gate 63. The contacts 151-20 to 151-23 are arranged vertically in a row.

In the surroundings (side surfaces) of the photodiode 51, the non-penetrating light shielding portion 107B and the penetrating light shielding portion 107C are arranged. The non-penetrating light shielding portion 107B and the penetrating light shielding portion 107C are seamlessly coupled in a direction parallel to the incident surface of the semiconductor substrate 101 and arranged seamlessly in the surroundings (side surfaces) of the photodiode 51. Further, the non-penetrating light shielding portion 107B is also seamlessly coupled to the horizontally adjacent pixel 50.

Among the light shielding portions surrounding the photodiode 51, the penetrating light shielding portion 107C is arranged between the photodiode 51 and the TX1 gate 55-1 and the TX2 gate 55-2 that are arranged in the same pixel as the photodiode 51. Further, the penetrating light shielding portion 107C is arranged between the photodiode 51 and the electric-charge holding unit 56 in the vertically adjacent pixel 50.

In other portions, the non-penetrating light shielding portion 107B is arranged. Specifically, the non-penetrating light shielding portion 107B is arranged between the photodiode 51 and the horizontally adjacent pixel 50. This is to form the gate portion and the contacts of each transistor. Further, the non-penetrating light shielding portion 107B is arranged between the photodiode 51 and the TRY gate 54 in the same pixel. This is to secure a channel through which electric charge flows from the photodiode 51 to the electric-charge holding unit 56. Further, the non-penetrating light shielding portion 107B is arranged in a portion (portion where the light shielding films 107 intersect) connecting the light shielding film 107 extending in the horizontal direction and the light shielding film 107 extending in the vertical direction. This is because in a case where the penetrating light shielding portion 107C is formed in this portion, etching may be accelerated due to a microloading phenomenon, causing the penetrating light shielding portion 107C to reach the wiring layer 104.

It is noted that due to the reason described later, the penetrating light shielding portion 107C is greater in width in the direction parallel to the incident surface of the semiconductor substrate 101 than the non-penetrating light shielding portion 107B.

Figure 5:
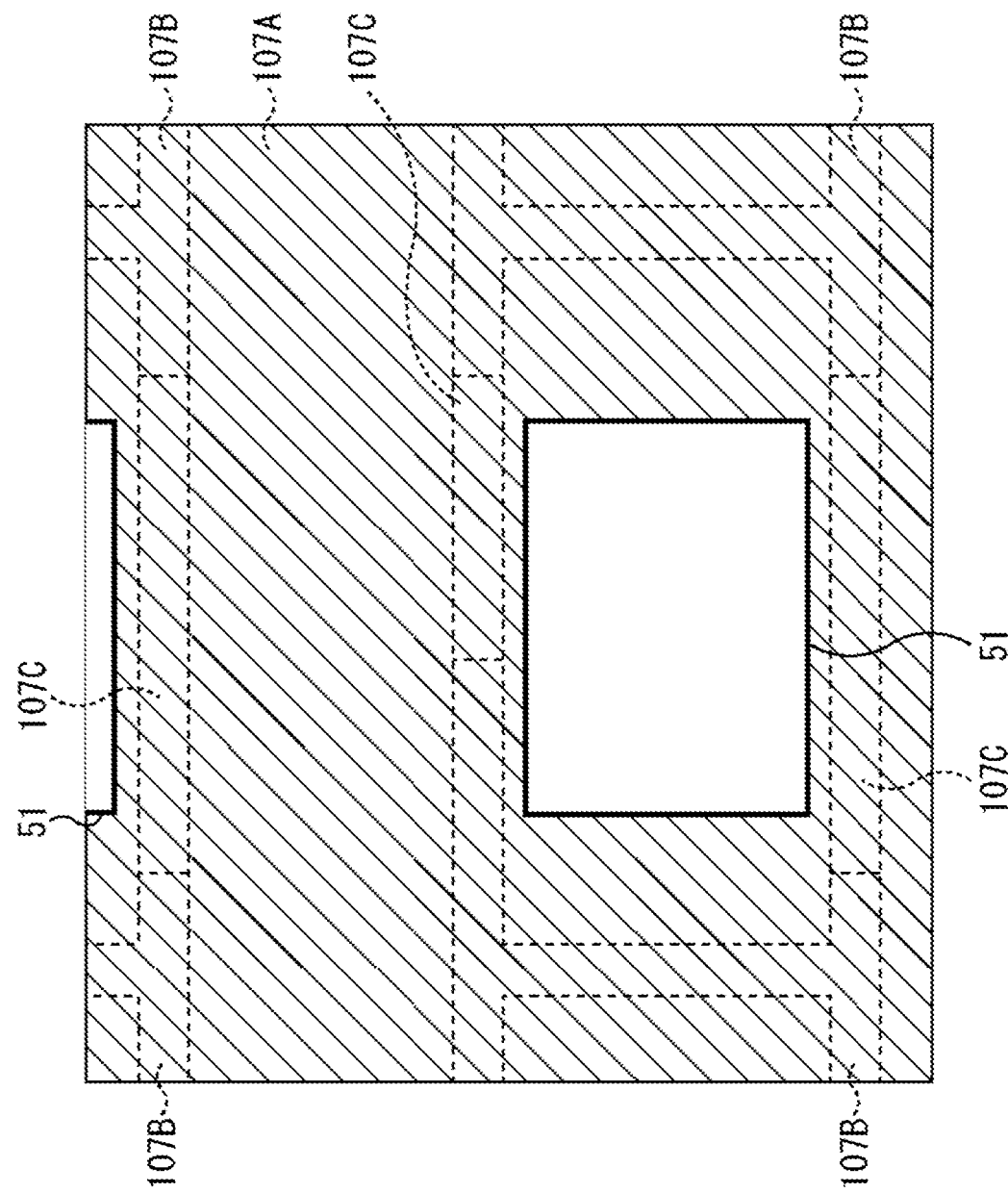
FIG. 5 is a schematic view of arrangement of the light shielding film at a light-receiving surface side of the semiconductor substrate with the light shielding structure illustrated in FIG. 3.

FIG. 5 schematically illustrates a planar layout of the incident surface of the semiconductor substrate 101 of the CMOS image sensor 10a illustrated in FIG. 3. The direction in which the pixels are arranged in FIG. 5 is the same as the direction in which the pixels are arranged in the cross-sectional view in FIG. 4. It is noted that a portion indicated by diagonal lines in the figure indicates a region where the surface light-shielding portion 107A is arranged. Further, in FIG. the positions of the non-penetrating light shielding portion 107B and the penetrating light shielding portion 107C are indicated by dotted lines.

As illustrated in this figure, the surface light-shielding portion 107A covers the region of the incident surface of the semiconductor substrate 101 except the light receiving surface of the photodiode 51.

Figure 6:
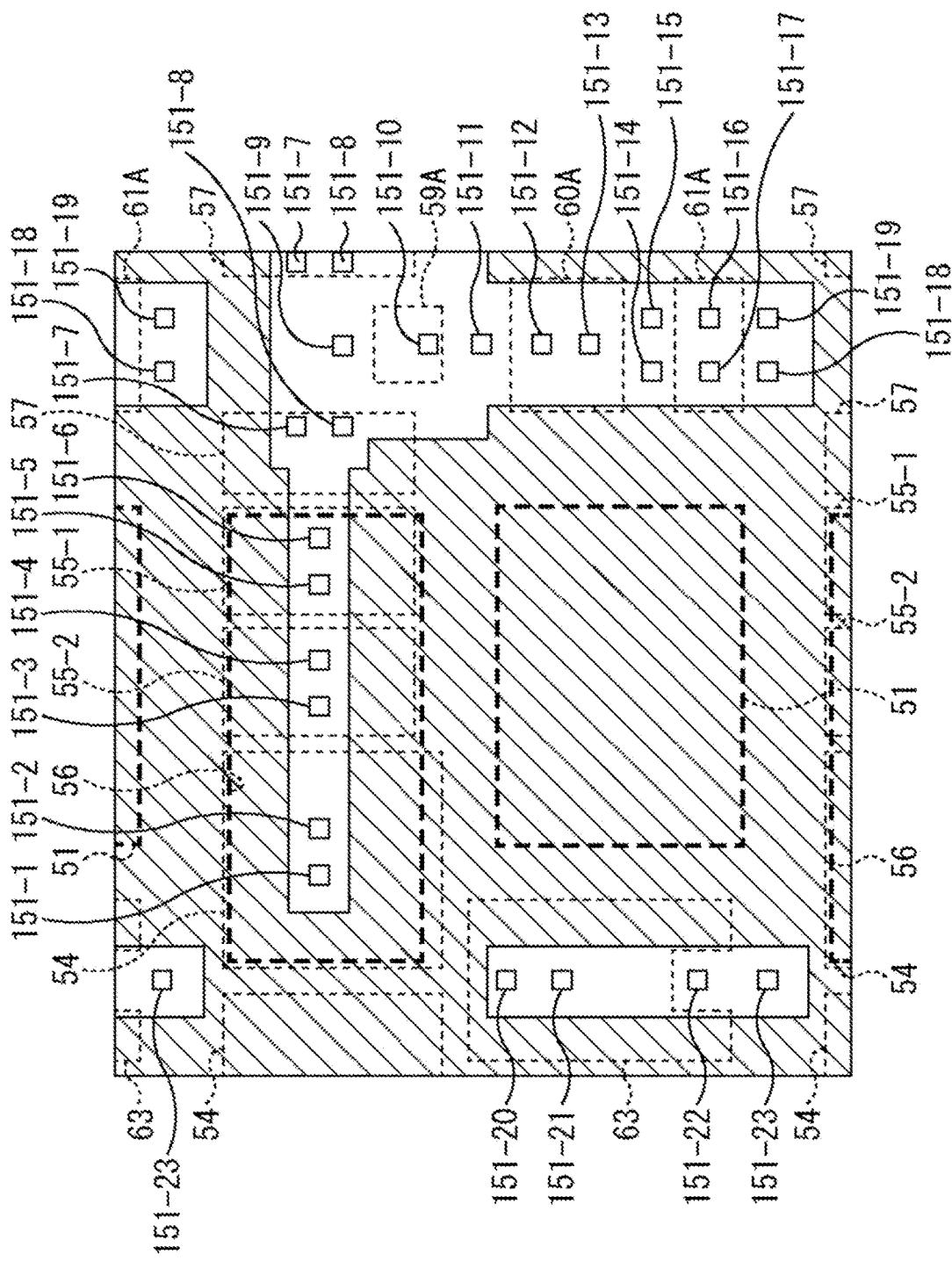
FIG. 6 is a schematic view of arrangement of the light shielding film at a boundary-surface side of the semiconductor substrate with the light shielding structure illustrated in FIG. 3.

FIG. 6 schematically illustrates a planar layout of the cross section of the CMOS image sensor 10a illustrated in FIG. 3 in the vicinity of a depth D2. The direction in which the pixels are arranged in the cross section in FIG. 6 is the same as the direction in which the pixels are arranged in the cross-sectional view in FIG. 4. It is noted that the portion indicated by diagonal lines in the figure indicates the region where the light shielding film 103 is arranged.

In FIG. 6, the positions of the photodiode 51, the TRY gate 54, the TX1 gate 55-1, the TX2 gate 55-2, the electric-charge holding unit 56, the TRG gate 57, the gate portion 59A of the reset transistor 59, the gate portion 60A of the amplification transistor 60, the gate portion 61A of the selection transistor 61, and the OFG gate 63 are indicated by dotted lines.

The light shielding film 103 is arranged in a region except an active region on the boundary surface of the semiconductor substrate 101 and the regions where the contacts 151-1 to 151-23 are arranged. Therefore, the bottom surface of the photodiode 51 is entirely covered by the light shielding film 103. Further, the bottom surface of the electric-charge holding unit 56 is substantially covered by the light shielding film 103 except the active region on the boundary surface of the semiconductor substrate 101 and the regions where the contacts 151-1 to 151-6 are arranged.

As illustrated in FIG. 5, the surface light-shielding portion 107A covers the region of the incident surface of the semiconductor substrate 101 except the region where light enters the photodiode 51. Therefore, most of the light that has entered the incident surface of the semiconductor substrate 101 does not enter the region except the light receiving surface of the photodiode 51. Further, the non-penetrating light shielding portion 107B and the penetrating light shielding portion 107C surrounding the side surfaces of the photodiode 51 prevent the light that has transmitted the photodiode 51 from entering the electric-charge holding unit 56. In addition, the penetrating light shielding portion 107C penetrating the semiconductor substrate 101 makes the light-shielding region larger, making it possible to further reduce the light that would otherwise enter the electric-charge holding unit 56. Further, the light shielding film 103 prevents the light that has transmitted the photodiode 51 from entering the wiring layer 104, thereby preventing the light reflected off the wiring layer 104 from entering the electric-charge holding unit 56. This reduces occurrence of optical noise that would be caused by the light having entered the electric-charge holding unit 56, thereby reducing light leakage noise at the time of the global shutter, for example.

Further, applying a negative bias to the penetrating light shielding portion 107C strengthens pinning, thereby reducing generation of the dark current. The reduction in the generation of the dark current reduces concentration of the p-type well layer 53 of the semiconductor substrate 101, thereby increasing surface charge density Qs of the semiconductor substrate 101 and the capacitance of the electric-charge holding unit 56. This improves pixel characteristics.

<1-4. Method for Manufacturing CMOS Image Sensor>

Next, a method for manufacturing the CMOS image sensor 10a will be described with reference to FIGS. 7 to 16.

It is noted that the photodiode 51, the electric-charge holding unit 56, the wiring layer 104, and the gate electrode 105 are not illustrated in FIGS. 7 to 16 so that the figures are more visible. Further, FIGS. 7 to 12 are cross-sectional views of the CMOS image sensor 10a taken along the portion A-A in FIG. 4, as seen from the right direction of FIG. 4. FIGS. 13 to 16 are cross-sectional views of the CMOS image sensor 10a taken along the portion B-B in FIG. 4, as seen from the downward direction of FIG. 4.

First, a first method for manufacturing the CMOS image sensor 10a will be described with reference to FIGS. 7 to 12.

Although not illustrated, a process for the front surface (boundary surface) of the semiconductor substrate 101 is performed before step 1.

First, a process until the formation of the gate electrode 105 is similar to a process for a typical CMOS image sensor.

Subsequently, the insulation film layer 102 is deposited on the boundary surface of the semiconductor substrate 101.

Subsequently, the light shielding film 103 is deposited. At this time, processing of the light shielding film 103 is stopped at the insulation film 102C or the insulation film 102B adjacent to the light shielding film 103.

Subsequently, the wiring layer 104 is formed by forming an interlayer insulation film, the contacts, and wiring.

Subsequently, the wiring layer 104 and the supporting substrate not illustrated are bonded.

Then, the back surface (incident surface) of the semiconductor substrate 101 is processed.

Specifically, in step 1, a pattern including a hard mask 201 is formed on the incident surface of the semiconductor substrate 101. The hard mask 201 includes an S102 film, for example.

In step 2, a pattern including a photoresist 202 is formed on a surface of the hard mask 201. Specifically, the photoresist 202 is applied to the surface of the hard mask 201. Subsequently, the photoresist 202 is patterned. An opening 202A and an opening 202B are formed in accordance with respective positions where the non-penetrating light shielding portion 107B and the penetrating light shielding portion 107C are to be formed.

In step 3, the hard mask 201 is processed through the opening 202A and the opening 202B of the photoresist 202, and a trench 203 and a trench 204 are formed in accordance with the respective positions where the non-penetrating light shielding portion 107B and the penetrating light shielding portion 107C are to be formed. After that, the photoresist 202 is removed.

In step 4, a pattern including a photoresist 205 is formed on the surface of the hard mask 201 so as to fill the trench 203. The photoresist 205 prevents the semiconductor substrate 101 from being processed through the trench 203 in subsequent step 5.

In step 5, the semiconductor substrate 101 is processed, and the trench 204 is dug down to the middle of the semiconductor substrate 101. It is noted that the depth of the trench 204 is adjusted according to the processing time of the semiconductor substrate 101 in subsequent step 6.

In step 6, the photoresist 205 is removed. Then, the semiconductor substrate 101 is processed and the trench 203 and the trench 204 are dug down at the same time. At this time, the semiconductor substrate 101 is processed until the trench 204 penetrates the semiconductor substrate 101 and reaches the insulation film 102A. This causes the trench 203 to be dug down to the middle of the semiconductor substrate 101. Here, the trench 204 processed the second time is greater in width in the direction parallel to the incident surface of the semiconductor substrate 101 than the trench 203 processed the first time.

In step 7, isotropic etching using chemical dry etching (ODE) removes damage caused by the processing of side walls of the trench 203 and the trench 204, thereby optimizing the shapes of the trench 203 and the trench 204. At this time, isotropic etching removes the insulation film 102A at the bottom of the trench 204, and the trench 204 reaches the insulation film 102B as indicated by a circled portion in the figure. It is noted that the width of the trench 204 is kept greater than the width of the trench 203. As a result, the width of the penetrating light shielding portion 107C formed in the trench 204 is greater than the width of the non-penetrating light shielding portion 107B formed in the trench 203.

In step 8, a pattern including a photoresist 206 coats the surface of the hard mask 201, the inside of the trench 203, and the inside of the trench 204. The photoresist 206 prevents the trench 204 from being dug down by a chemical solution for removing the hard mask 201 in subsequent steps 9 and 10.

In step 9, etch-back is performed, whereby the photoresist 206 on the surface of the hard mask 201 is removed and a part of the surface of the hard mask 201 is removed. It is noted that the photoresist 206 inside the trench 203 and the trench 204 remains without being removed.

In step 10, wet etching is performed using BHF (buffered hydrofluoric acid), whereby the hard mask 201 is removed.

In step 11, the photoresist 206 inside the trench 203 and the trench 204 is removed by a SH treatment using sulfuric acid and hydrogen peroxide solution. At this time, the light shielding film 103 is prevented from being dissolved because the depth of the trench 204 has been stopped at the insulation film 102B in step 7.

In step 12, the multi-layer film 106 is formed so as to cover the incident surface of the semiconductor substrate 101 and the inner walls and the bottoms of the trench 203 and the trench 204. For example, the multi-layer film 106 includes a film having a three-layer structure in which the fixed electric charge film, the anti-reflection film, and the insulation film are stacked in order from closest to the semiconductor substrate 101. After that, annealing is performed.

In step 13, an insulation film 207 with low coverage is deposited. That is, the insulation film 207 is deposited so as to substantially cover only the incident surface of the semiconductor substrate 101 without covering the inner walls and the bottoms of the trench 203 and the trench 204.

In step 14, a pattern including a photoresist 208 is formed on the surface of the insulation film 207 so as to fill the trench 203. The photoresist 208 prevents the trench 203 from being processed in subsequent steps 14 and 15.

In step 15, etch-back is performed. As a result, at least a portion of the photoresist 208 formed on the insulation film 207 is removed.

In step 16, etch-back is performed further. Consequently, the insulation film 207 and the photoresist 208 in the trench 203 are removed, and at the same time, the trench 204 is dug down. Then, the multi-layer film 106, the insulation film 102B, and the insulation film 102C at the bottom of the trench 204 are removed, and the trench 204 penetrates the insulation film layer 102, reaching the light shielding film 103.

In step 17, a barrier film, not illustrated, is formed so as to cover the surface of the multi-layer film 106 and the inner walls and the bottoms of the trench 203 and the trench 204. The barrier film includes a film of Ti, TiN, or the like, for example. Subsequently, the light shielding film 107 is buried in the trench 203 and the trench 204 of the semiconductor substrate 101 and is formed so as to cover the incident surface of the semiconductor substrate 101. At this time, the penetrating light shielding portion 107C formed inside the trench 204 penetrates the semiconductor substrate 101, the insulation film 102A, the insulation film 102B, and the insulation film 102C, and is coupled to the light shielding film 103. Further, the surface light-shielding Portion 107A on the incident surface of the semiconductor substrate 101 is patterned so as to expose the light receiving surface of the photodiode 51.

Subsequently, although not illustrated, a passivation film is formed on the incident surface of the semiconductor substrate 101. After that, a color filter, a lens, a pad, and the like are formed.

Next, a second method for manufacturing the CMOS image sensor 10a will be described with reference to FIGS. 13 to 16. The second manufacturing method is mainly characterized by the process for the front surface (boundary surface) of the semiconductor substrate 101. The steps in this process will be mainly described.

In step 101, the insulation film 102A is deposited on the front surface of the semiconductor substrate 101.

In step 102, the insulation film 102B is deposited on the insulation film 102A.

In step 103, a pattern including a photoresist 221 is formed on the surface of the insulation film 102B. Specifically, the photoresist 221 is applied to the surface of the insulation film 102B. Subsequently, the photoresist 221 is patterned. An opening 221A is formed in accordance with a position where the penetrating light shielding portion 107C is to be formed.

In step 104, the insulation film 102B is processed through the opening 221A of the photoresist 221, whereby a trench 222 is formed in accordance with a position where the penetrating light shielding portion 107C is to be formed. After that, the photoresist 221 is removed.

In step 105, an oxide film including, for example, SiO2 is deposited on the surface of the insulation film 102B, and at the same time, the oxide film fills the trench 222. As a result, the insulation film 1020 is formed.

In step 106, the light shielding film 103 is deposited on the surface of the insulation film 102C.

Figure 7:
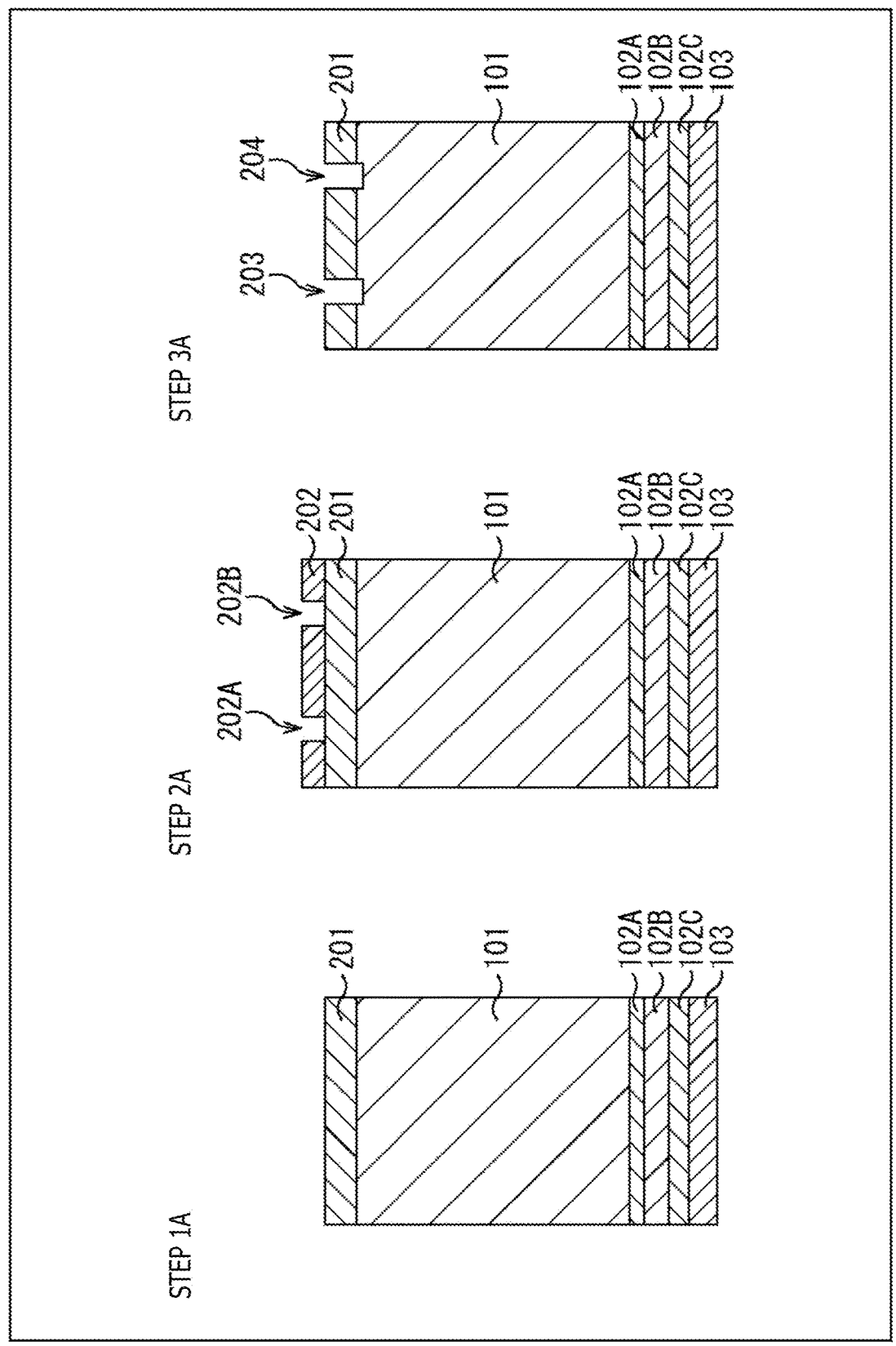
FIG. 7 is a diagram for describing a first method for manufacturing the CMOS image sensor having the light shielding structure illustrated in FIG. 3.
Figure 8:
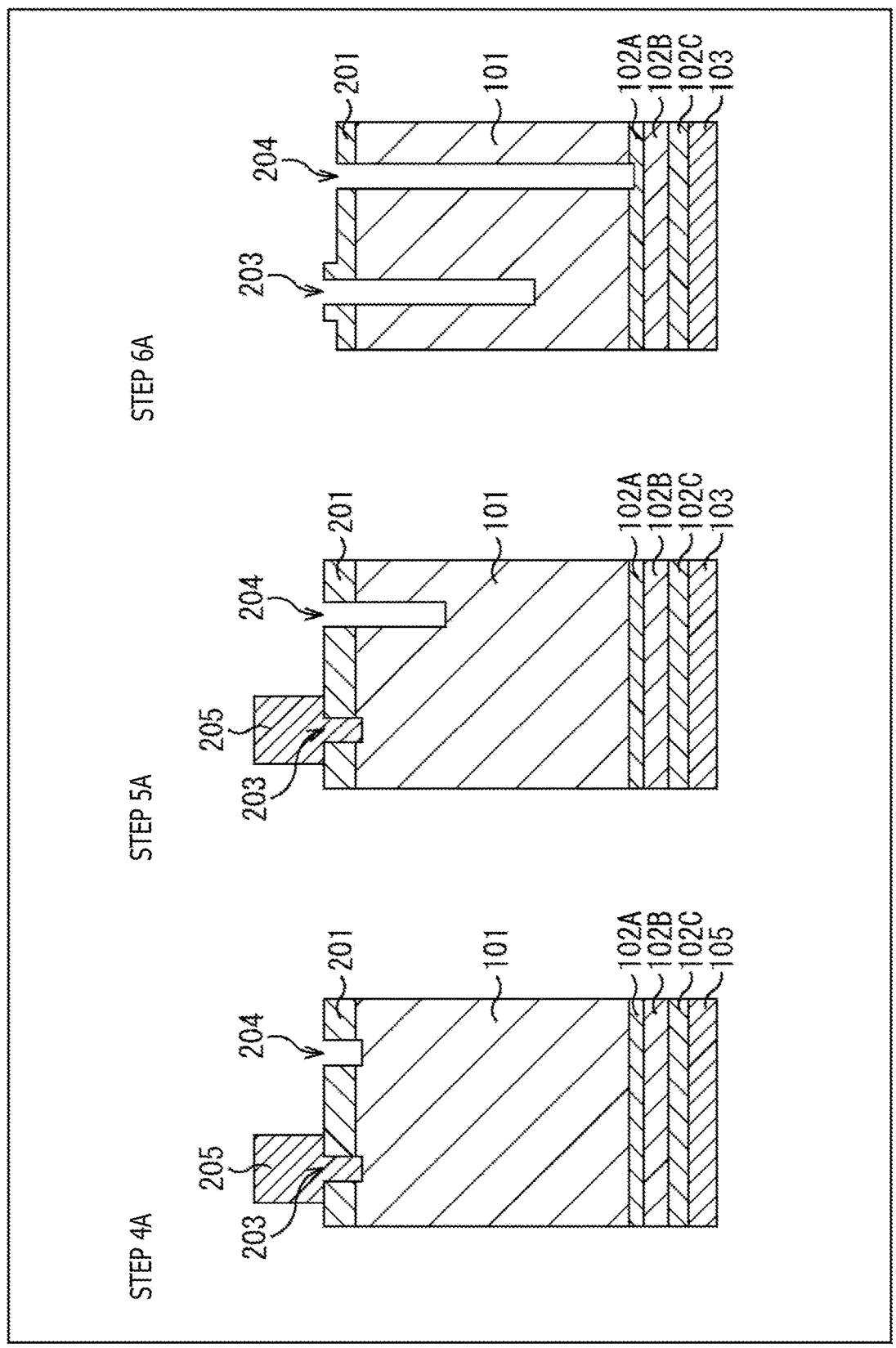
FIG. 8 is a diagram for describing the first method for manufacturing the CMOS image sensor having the light shielding structure illustrated in FIG. 3.
Figure 9:
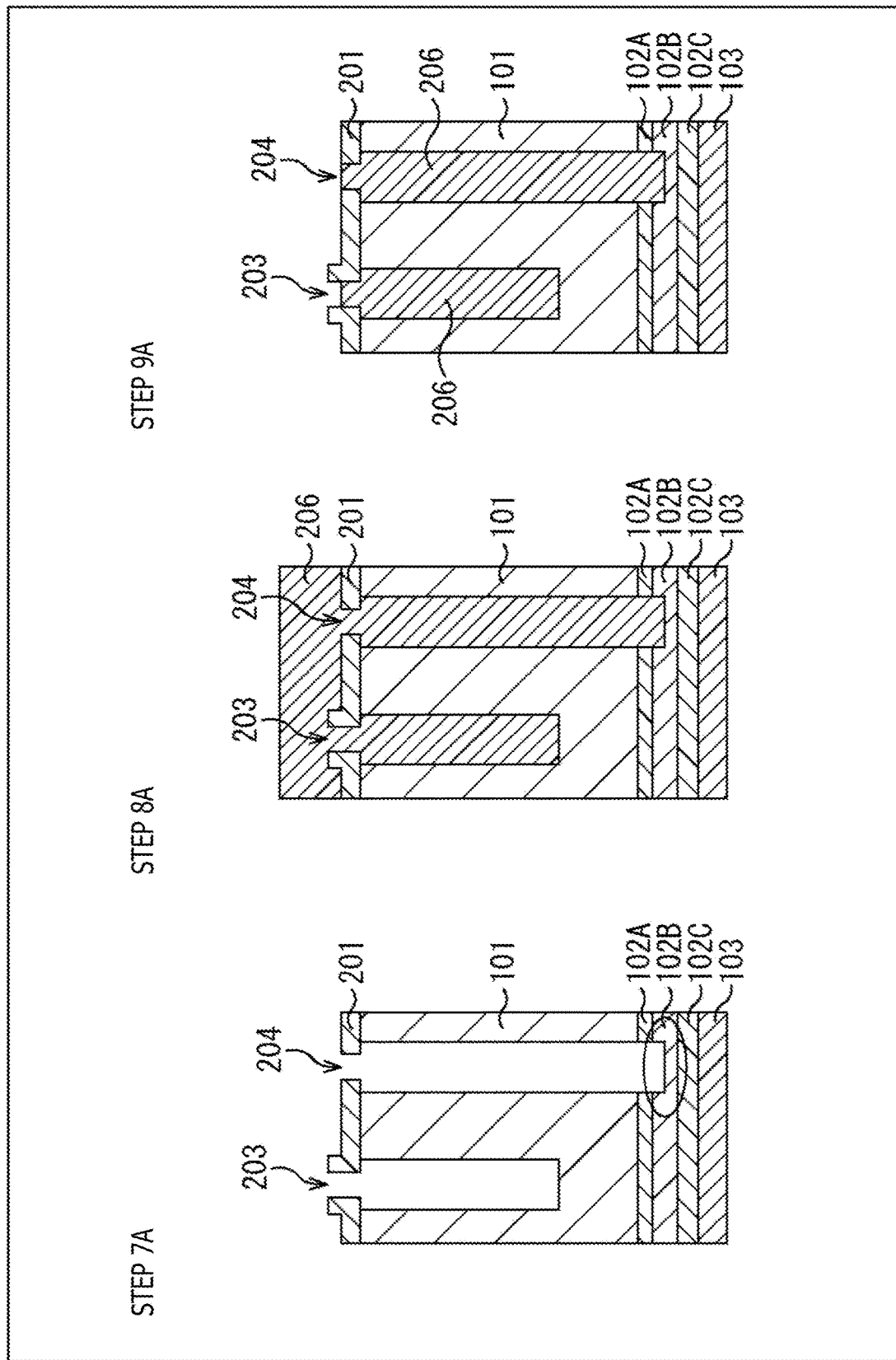
FIG. 9 is a diagram for describing the first method for manufacturing the CMOS image sensor having the light shielding structure illustrated in FIG. 3.
Figure 10:
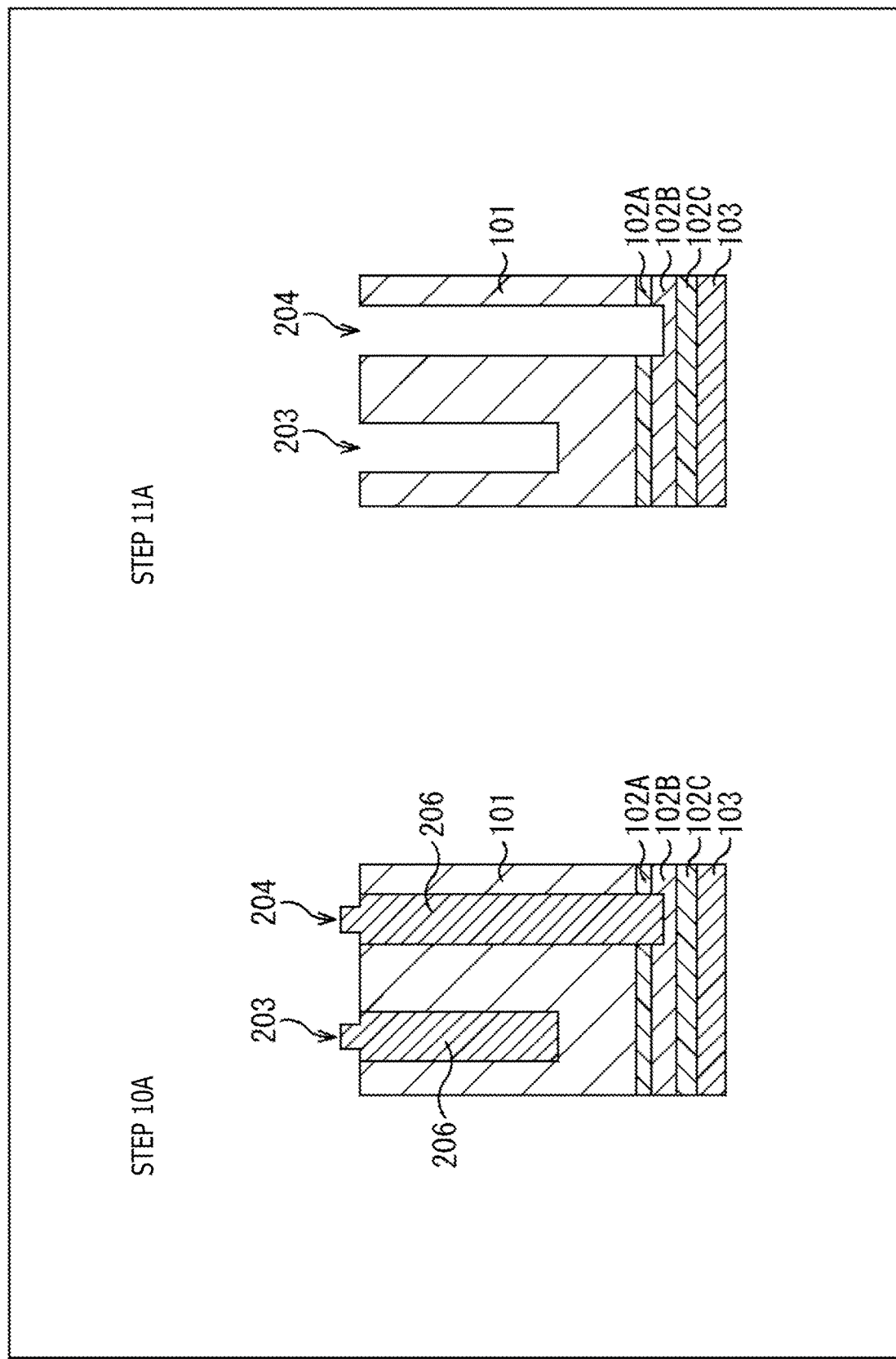
FIG. 10 is a diagram for describing the first method for manufacturing the CMOS image sensor having the light shielding structure illustrated in FIG. 3.

In step 107, steps similar to steps 1 to 7 in FIGS. 7 to 9 are performed, whereby the trench 203 and the trench 204 are formed in the semiconductor substrate 101.

It is noted that the figure illustrating step 107 is upside down from the figure illustrating step 106. Further, a region indicated by a dotted line in the figures illustrating steps 107 and after indicates the semiconductor substrate 101, which serves as the back walls of the trench 203 and the trench 204.

Figure 11:
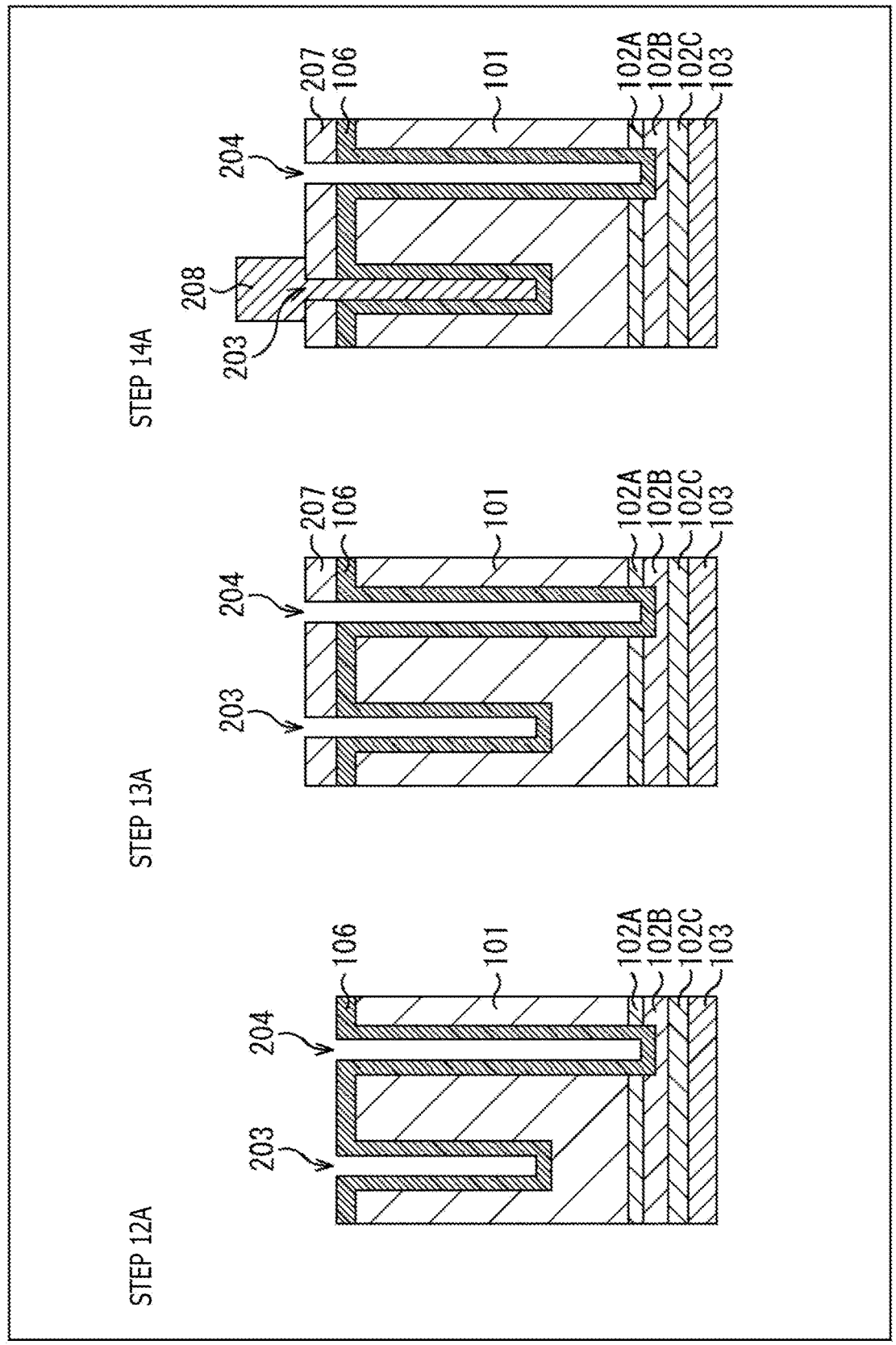
FIG. 11 is a diagram for describing the first method for manufacturing the CMOS image sensor having the light shielding structure illustrated in FIG. 3.
Figure 12:
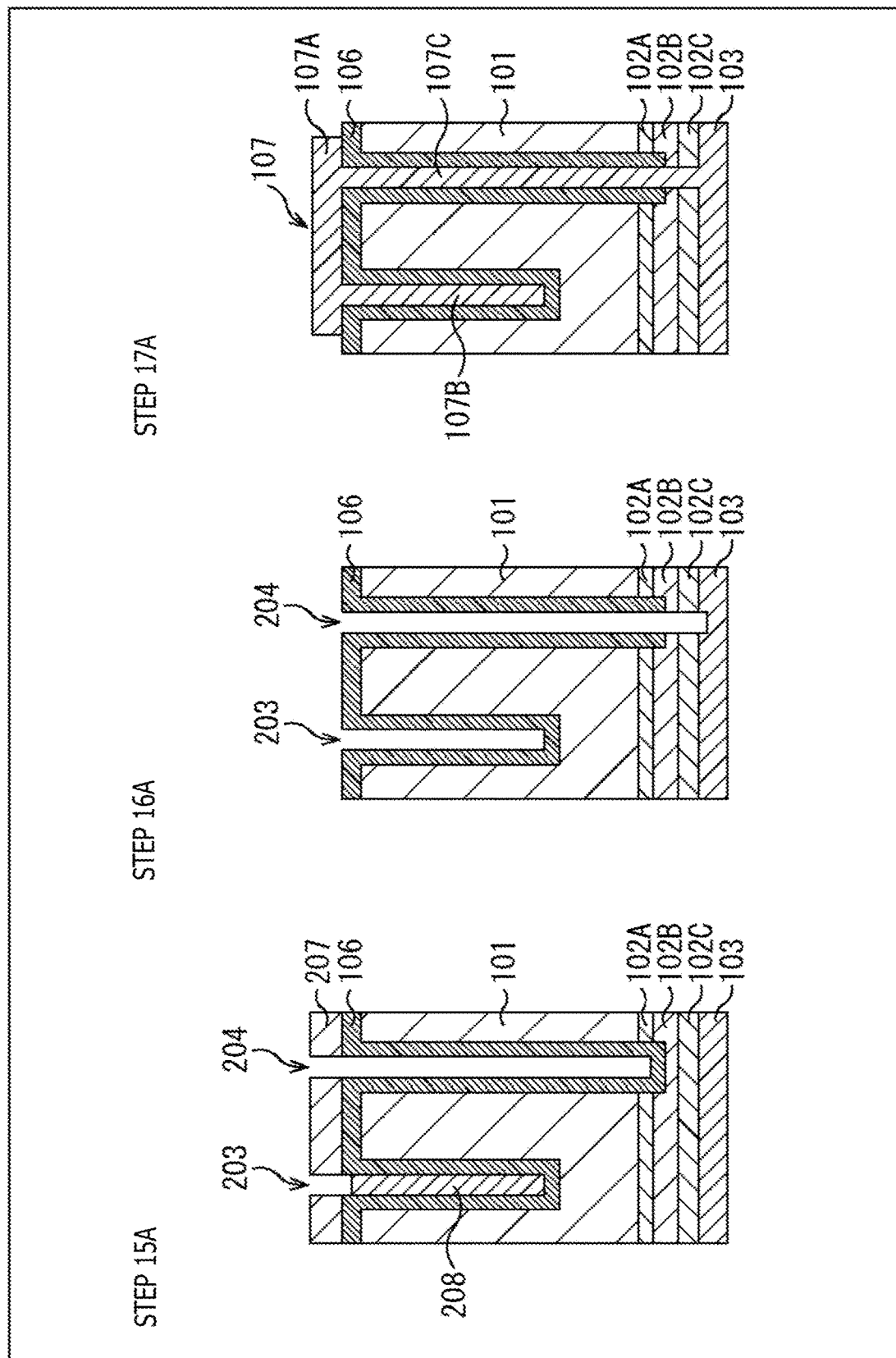
FIG. 12 is a diagram for describing the first method for manufacturing the CMOS image sensor having the light shielding structure illustrated in FIG. 3.
Figure 13:
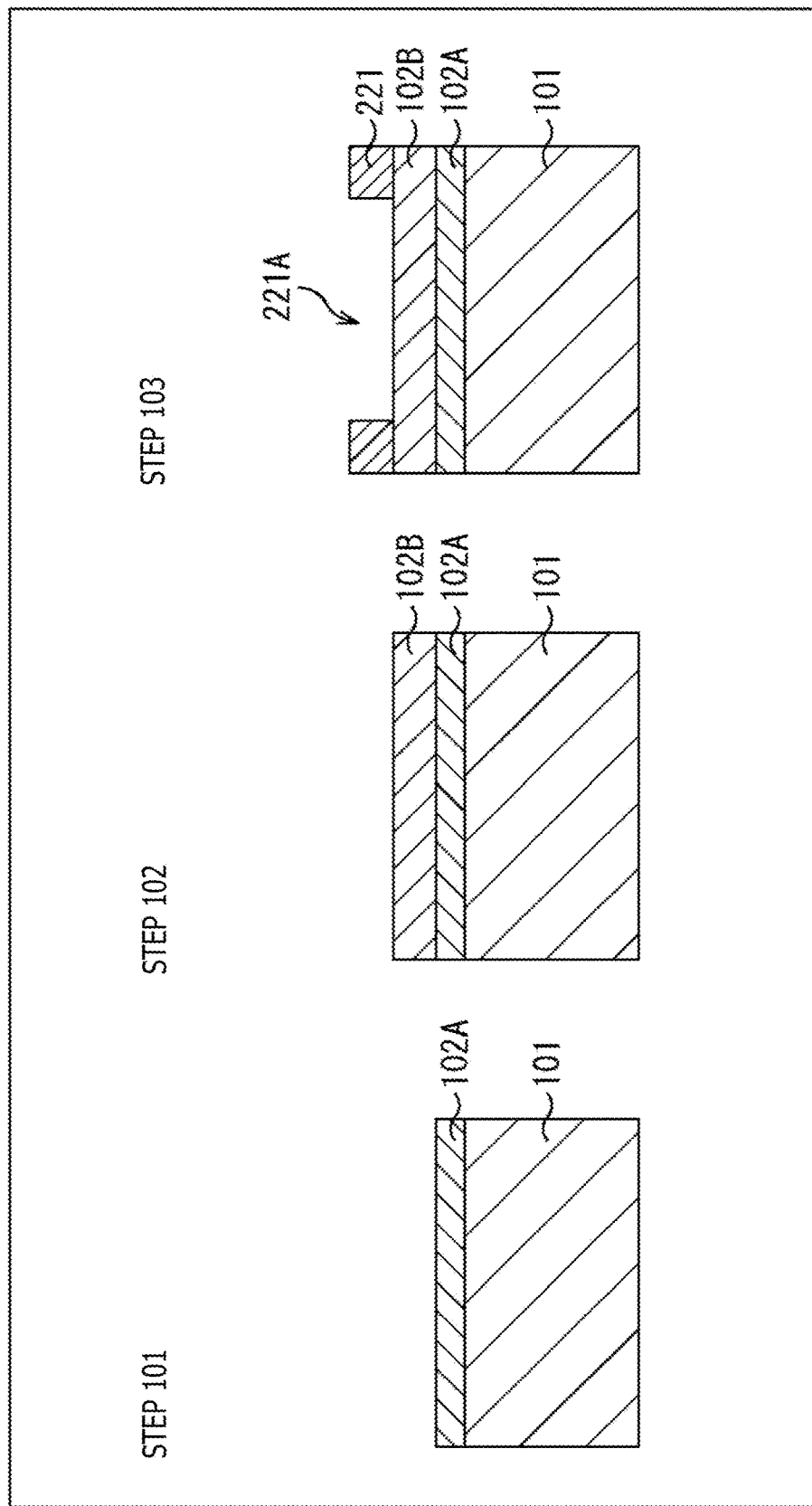
FIG. 13 is a diagram for describing a second method for manufacturing the CMOS image sensor having the light shielding structure illustrated in FIG. 3.
Figure 14:
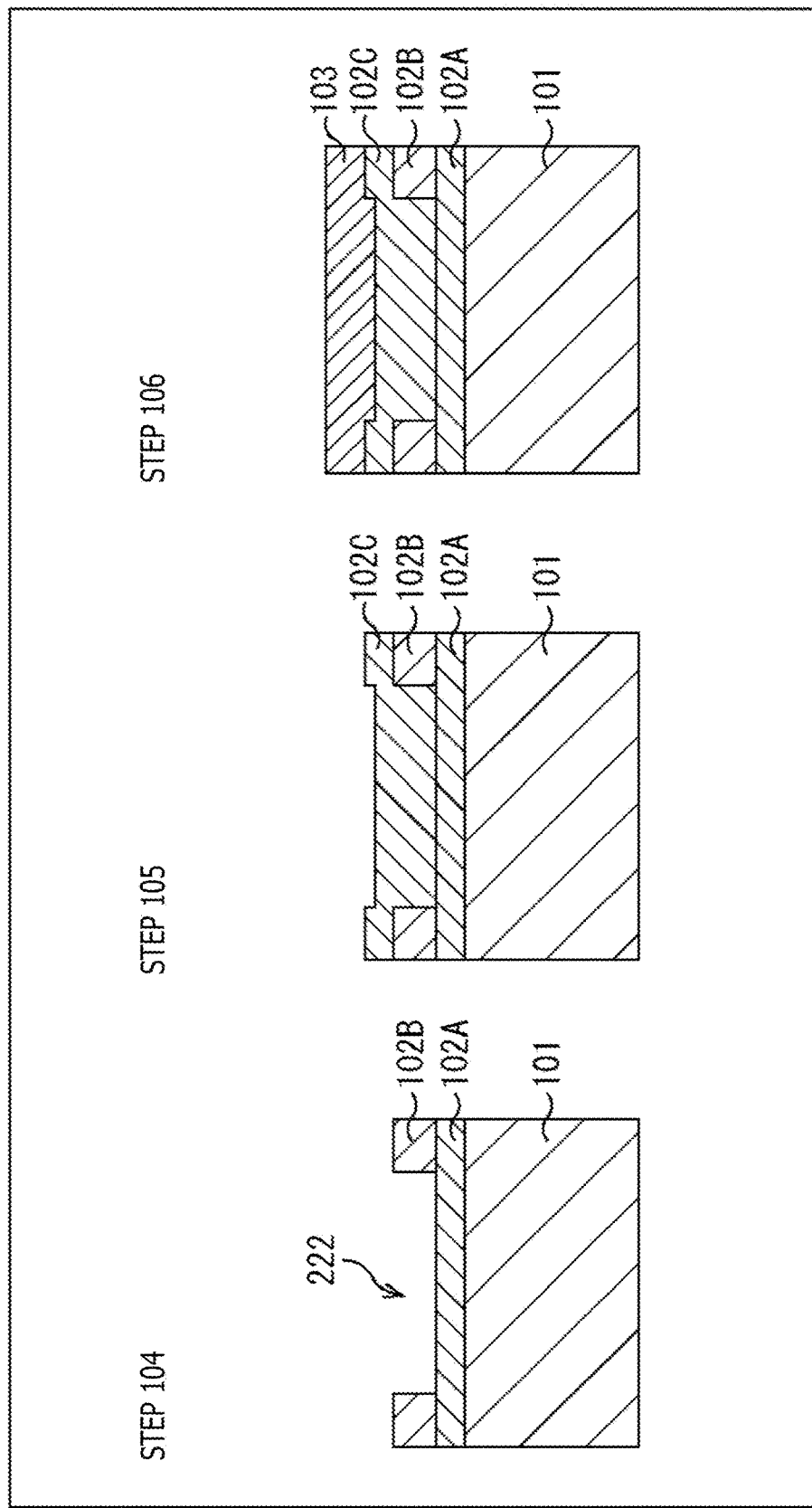
FIG. 14 is a diagram for describing the second method for manufacturing the CMOS image sensor having the light shielding structure illustrated in FIG. 3.
Figure 15:
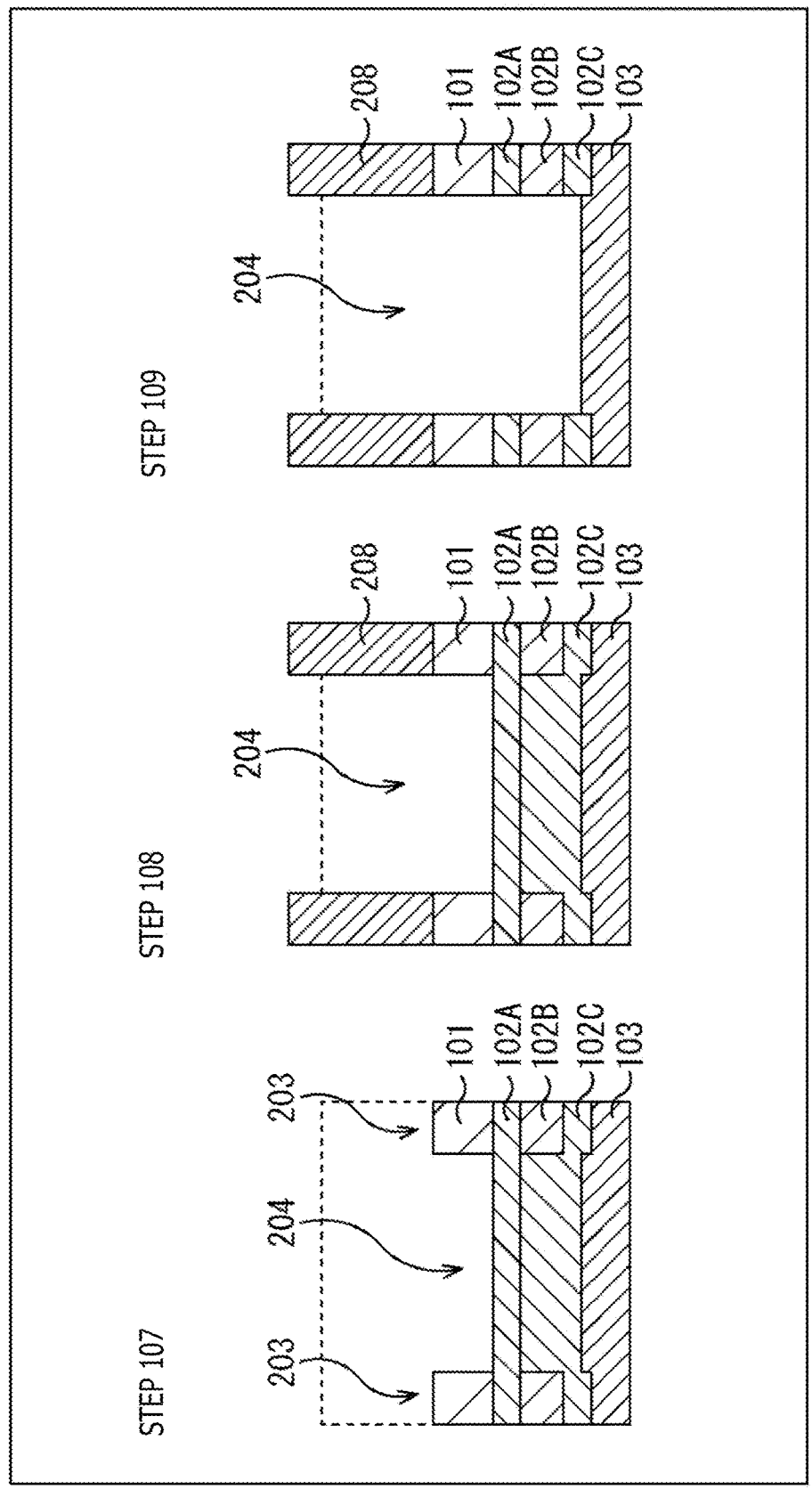
FIG. 15 is a diagram for describing the second method for manufacturing the CMOS image sensor having the light shielding structure illustrated in FIG. 3.
Figure 16:
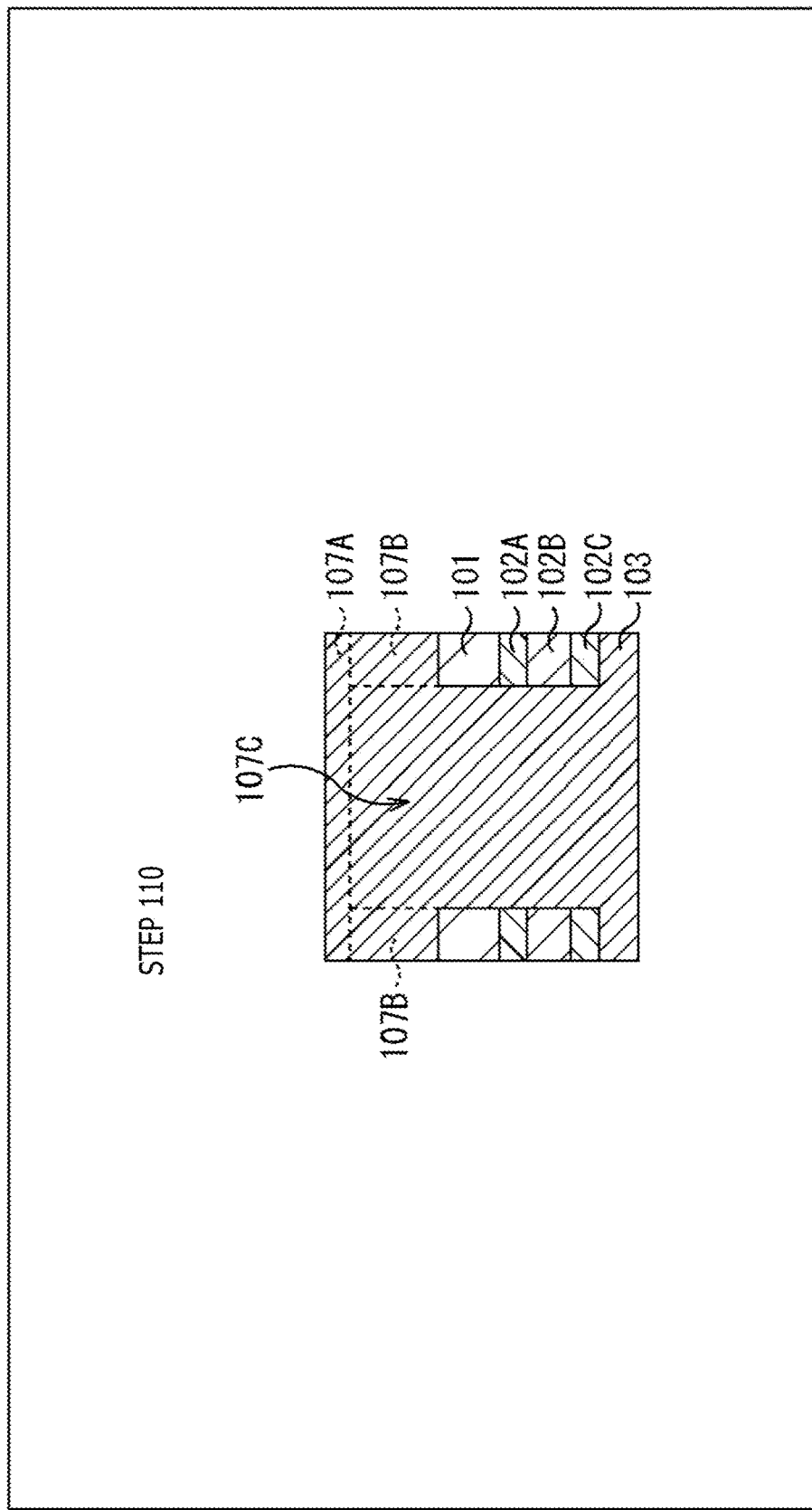
FIG. 16 is a diagram for describing the second method for manufacturing the CMOS image sensor having the light shielding structure illustrated in FIG. 3.

In step 108, a step similar to step 12 in FIG. 11 is performed, whereby the multi-layer film 106 (not illustrated) is formed so as to cover the incident surface of the semiconductor substrate 101 and the inner walls and the bottoms of the trench 203 and the trench 204. Subsequently, a step similar to step 14 in FIG. 11 is performed, whereby a pattern including the photoresist 208 is formed so as to fill the trench 203.

In step 109, etch-back is performed. Consequently, the insulation film 102A below the trench 204 is removed. In addition, the oxide film (part of the insulation film 102C)

filling the trench 222 of the insulation film 102B in step 105 and the insulation film 102C thereunder are removed. As a result, the trench 204 penetrates the insulation film 102A through the insulation film 102C, reaching the light shielding film 103.

In step 110, after the photoresist 208 is removed, a barrier film, not illustrated, is formed so as to cover the surface of the multi-layer film 106 (not illustrated) and the inner walls and the bottoms of the trench 203 and the trench 204. Subsequently, the light shielding film 107 is buried in the trench 203 and the trench 204 of the semiconductor substrate 101 and is formed so as to cover the incident surface of the semiconductor substrate 101. At this time, the penetrating light shielding portion 107C formed in the trench 204 penetrates the semiconductor substrate 101, the insulation film 102A, the insulation film 102B, and the insulation film 102C, and is coupled to the light shielding film 103. Further, the surface light-shielding portion 107A on the incident surface of the semiconductor substrate 101 is patterned so as to expose the light receiving surface of the photodiode 51.

It is noted that dotted lines in the figure illustrating step 110 are auxiliary lines indicating the positions of the surface light-shielding portion 107A, the non-penetrating light shielding portion 107B, and the penetrating light shielding portion 107C.

Subsequently, although not illustrated, a passivation film is formed on the incident surface of the semiconductor substrate 101. After that, a color filter, a lens, a pad, and the like are formed.

In this manner, the trench 222 is formed in the insulation film 102B and filled with the same oxide film as the insulation film 102A and the insulation film 102C. As a result, variations in the width of the trench 204 formed in the insulation film 102A through the insulation film 102O in step 109 in FIG. 15 in the direction of B-B in FIG. 4 are reduced among the pixels 50. Therefore, variations in the width of the penetrating light shielding portion 107C in the direction of B-B in FIG. 4 are reduced among the pixels 50. As a result, variations in characteristics among the pixels 50 are reduced, whereby the image quality of the CMOS image sensor 10a is improved.

It is noted that PTL 1 described above does not disclose a specific method for forming the light shielding film. Therefore, with the technology recited in PTL 1, for example, the trench for forming the light shielding film may be dug down so deeply that the light shielding film may protrude into the wiring layer or a shape defect may be generated when the light shielding film or the contact at the front-surface side of the semiconductor substrate is formed. This may result in image quality deterioration such as white spots.

2. Second Embodiment

Next, the second embodiment of the present technology will be described with reference to FIG. 17.

Figure 17:
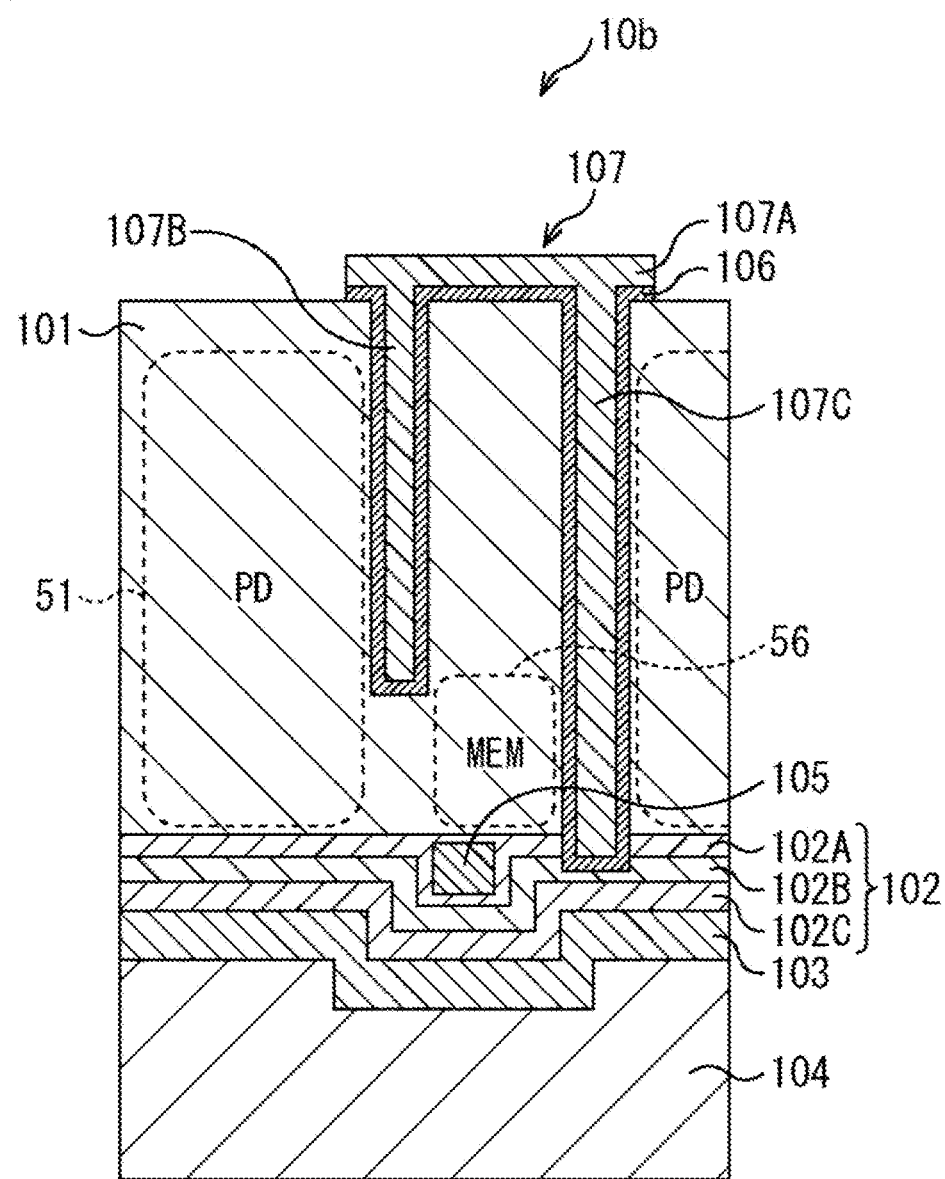
FIG. 17 is a schematic cross-sectional view of a second embodiment of the light shielding structure of the CMOS image sensor illustrated in FIG. 1.

FIG. 17 is a schematic cross-sectional view of the light shielding structure of a CMOS image sensor 10b, similar to FIG. 3.

In comparison with the CMOS image sensor 10a in FIG. 3, the CMOS image sensor 10b is different in that although the penetrating light shielding film 107C penetrates the semiconductor substrate 101, the penetrating light shielding film 107C is stopped at the insulation film 102B and is not coupled to the light shielding film 103.

It is noted that steps of manufacturing the CMOS image sensor 10b are similar to the steps of manufacturing the CMOS image sensor 10a until step 12 (FIG. 11). After that, steps 13 through 16 are omitted, and the light shielding film 107 is formed through a step similar to step 17.

3. Modification

Hereinafter, a modification of the above-described embodiments of the technology according to the present disclosure will be described.

For example, the insulation layer film 102 may have a structure other than the three-layer structure described above.

For example, the insulation film layer 102 may have a one-layer structure including the insulation film 102A. In this case, however, the insulation film 102A needs to be thickened. Further, providing the insulation film 102B different in composition from the insulation film 102A more easily stops the trench 204 inside the insulation film layer 102 with the control of an etching selection ratio in the above-described step 7, for example.

Further, for example, the insulation film layer 102 may have a two-layer structure including the insulation film 102A and the insulation film 102B. However, providing the insulation film 102C makes it possible to reduce peeling between the insulation film layer 102 and the light shielding film 103 and shaving of the insulation film 102B at the time of processing of the light shielding film 103.

In addition, the insulation film 102B may include an oxynitride film such as an SiON film, for example.

Further, the present technology is applicable to any back-illuminated imaging devices including the electric-charge holding unit. Therefore, the configuration of the CMOS image sensor 10 in FIG. 1 and the configuration of the pixel 50 in FIG. 2 described above are examples and can be changed appropriately. Further, for example, the conductivity type of each semiconductor region may be reversed. In this case, the positive and negative of the bias voltage to be applied are reversed.

4. Application Examples

The technology according to the present disclosure is applicable to various products.

<4-1. Application Examples of Technology According to Present Disclosure>

Figure 18:
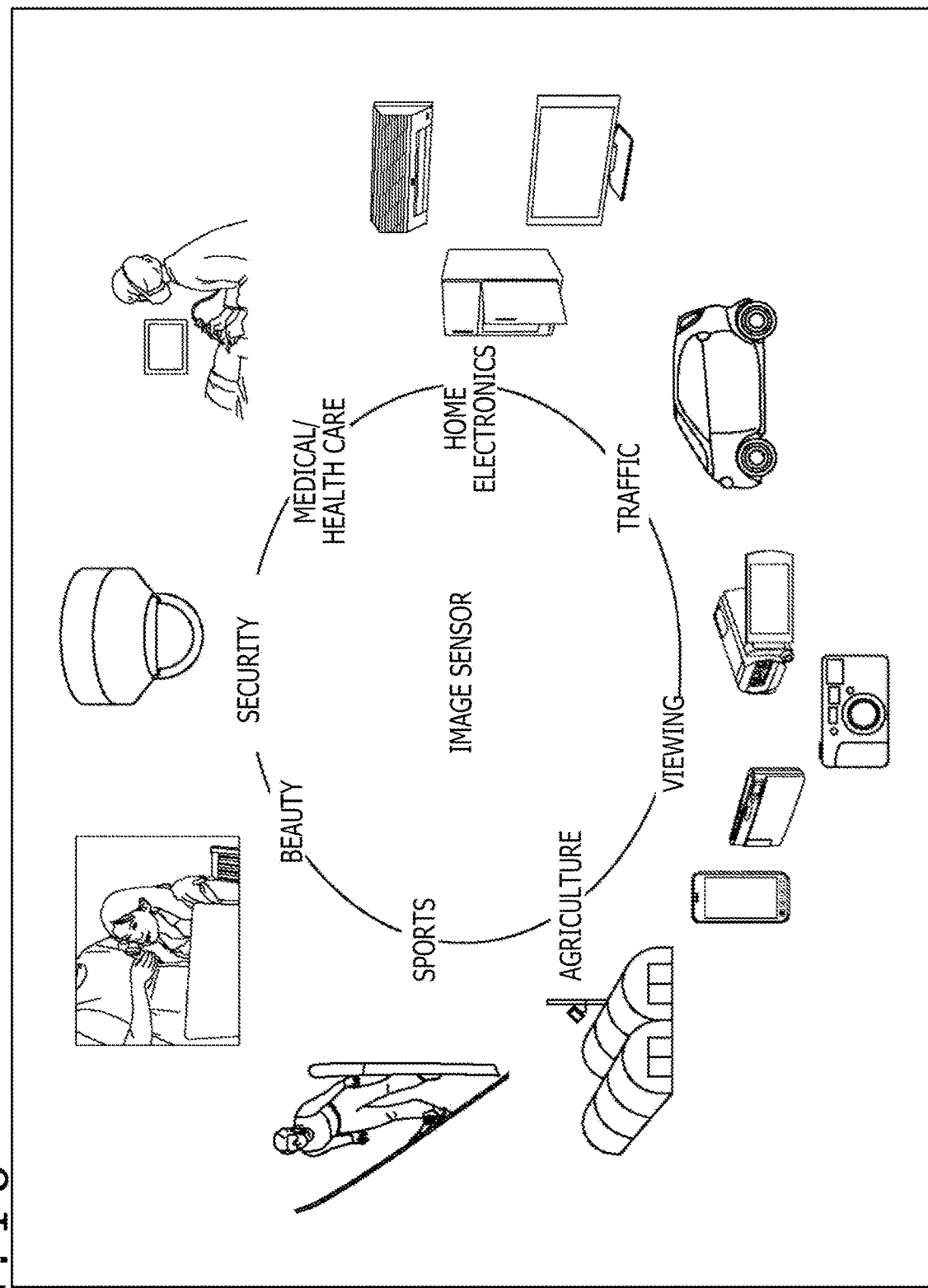
FIG. 18 is a diagram illustrating usage of an imaging device.

For example, as illustrated in FIG. 18, the technology according to the present disclosure is applicable to various cases of sensing light such as visible light, infrared light, ultraviolet light, X-rays, and the like.

- Devices for capturing images provided for viewing such as digital cameras and mobile devices having a camera function
- Devices for traffic such as: on-vehicle sensors that image the front, the rear, the surroundings, and the inside of a vehicle in order to, for example, achieve safe driving such as automatic stop and recognize the state of the driver; surveillance cameras that monitor traveling vehicles and roads; and distance measurement sensors that measure the distance between vehicles
- Devices for home electronics such as TVs, refrigerators, and air conditioners in order to image the user's gesture and operate the equipment according to the gesture
- Devices for medical and health care such as endoscopes and devices that carry out angiography using received infrared light
- Devices for security such as security surveillance cameras and cameras for person identification Devices for beauty such as skin measurement equipment that images the skin and microscopes that image the scalp Devices for sports such as action cameras and wearable cameras for sports and the like Devices for agriculture such as cameras that monitor the conditions of fields and crops Hereinafter, more specific application examples will be described.

<4-2. Examples of Application to Electronic Devices>

Figure 19:
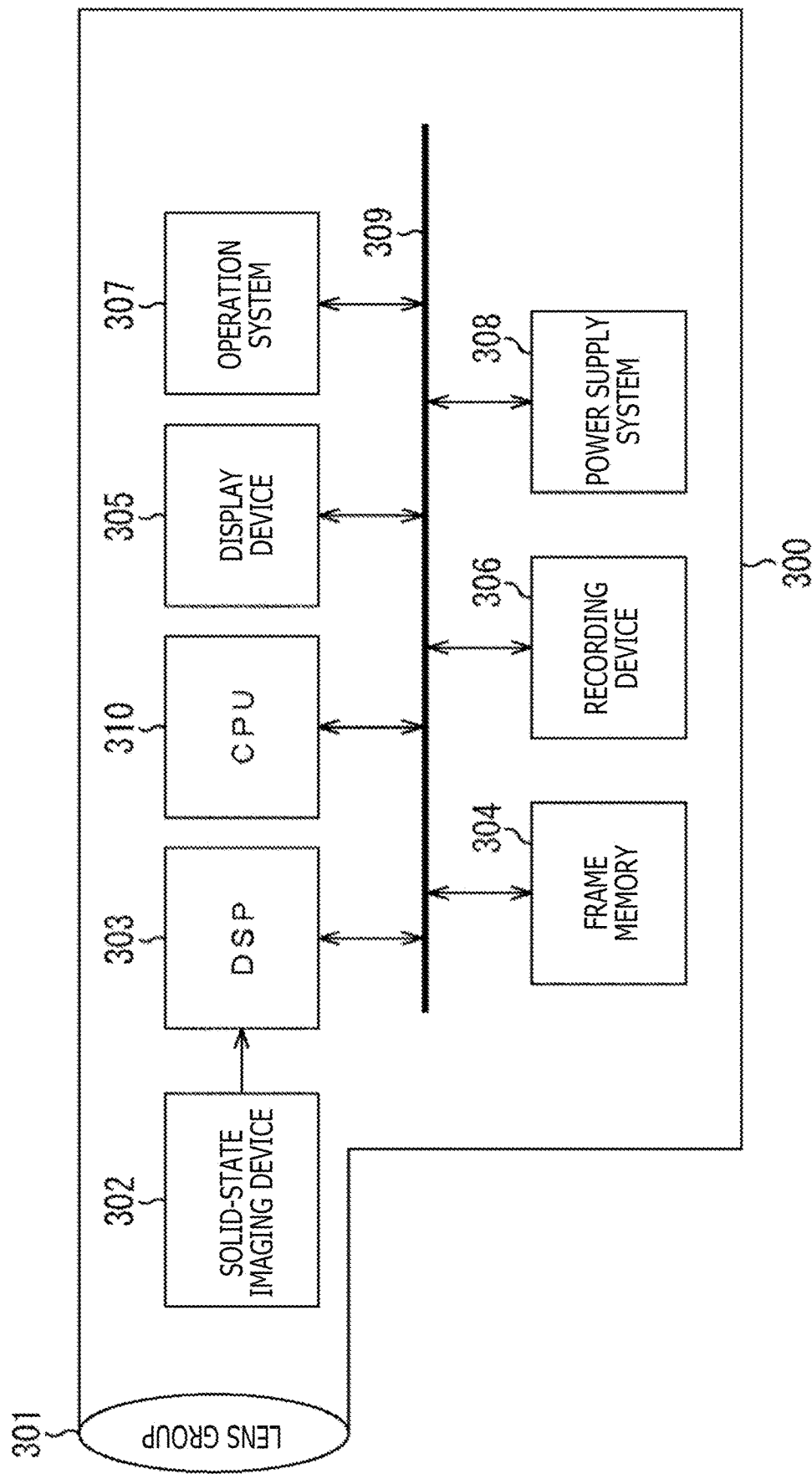
FIG. 19 is a block diagram illustrating an exemplary configuration of an electronic device.

FIG. 19 is a block diagram illustrating an exemplary configuration of an imaging apparatus 300, which is an example of an electronic device to which the imaging device according to the present technology is applied. The imaging apparatus 300 includes an optical system, a solid-state imaging device 302, a DSP circuit 303, a frame memory 304, a display device 305, a recording device 306, an operation system 307, a power supply system 308, and the like. The optical system includes a lens group 301 and the like. The DSP circuit 303 functions as a camera signal processing unit and processes a signal from the solid-state imaging device 302.

Further, the DSP circuit 303, the frame memory 304, the display device 305, the recording device 306, the operation system 307, and the power supply system 308 are mutually connected via a bus line 309. A CPU 310 controls each unit inside the imaging apparatus 300.

The lens group 301 captures incident light (image light) from a subject and forms an image on an imaging surface of the solid-state imaging device 302. The solid-state imaging device 302 converts the amount of incident light from which the image has been formed on the imaging surface through the lens group 301 into electric signals in each pixel, and then outputs the electric signals as pixel signals. For example, the CMOS image sensor 10 described above can be used as the solid-state imaging device 302.

The display device 305 includes a panel display device such as a liquid-crystal display device and an organic EL (electro luminescence) display device. The display device 305 displays a moving image or a still image captured by the solid-state imaging device 302. The recording device 306 records the moving image or the still image captured by the solid-state imaging device 302 on a recording medium such as a magnetic disk, an optical disk, a magneto-optical disk, or a semiconductor memory.

The operation system 307 issues operation instructions on various functions included in the imaging device according to the operation by the user. The power supply system 308 appropriately provides various types of power to the DSP circuit 303, the frame memory 304, the display device 305, the recording device 306, and the operation system 307 as operation power for these power supply targets.

The imaging apparatus 300 as described above is applied to a video camera, a digital still camera, and a camera module for a mobile device such as a smartphone and a mobile phone.

<4-3. Example of Application to Mobile Body>

Further, for example, the technology according to the present disclosure may be implemented as a device to be mounted on any type of mobile bodies such as vehicles, electric vehicles, hybrid electric vehicles, motorcycles, bicycles, personal mobility, airplanes, drones, ships, and robots.

Figure 20:
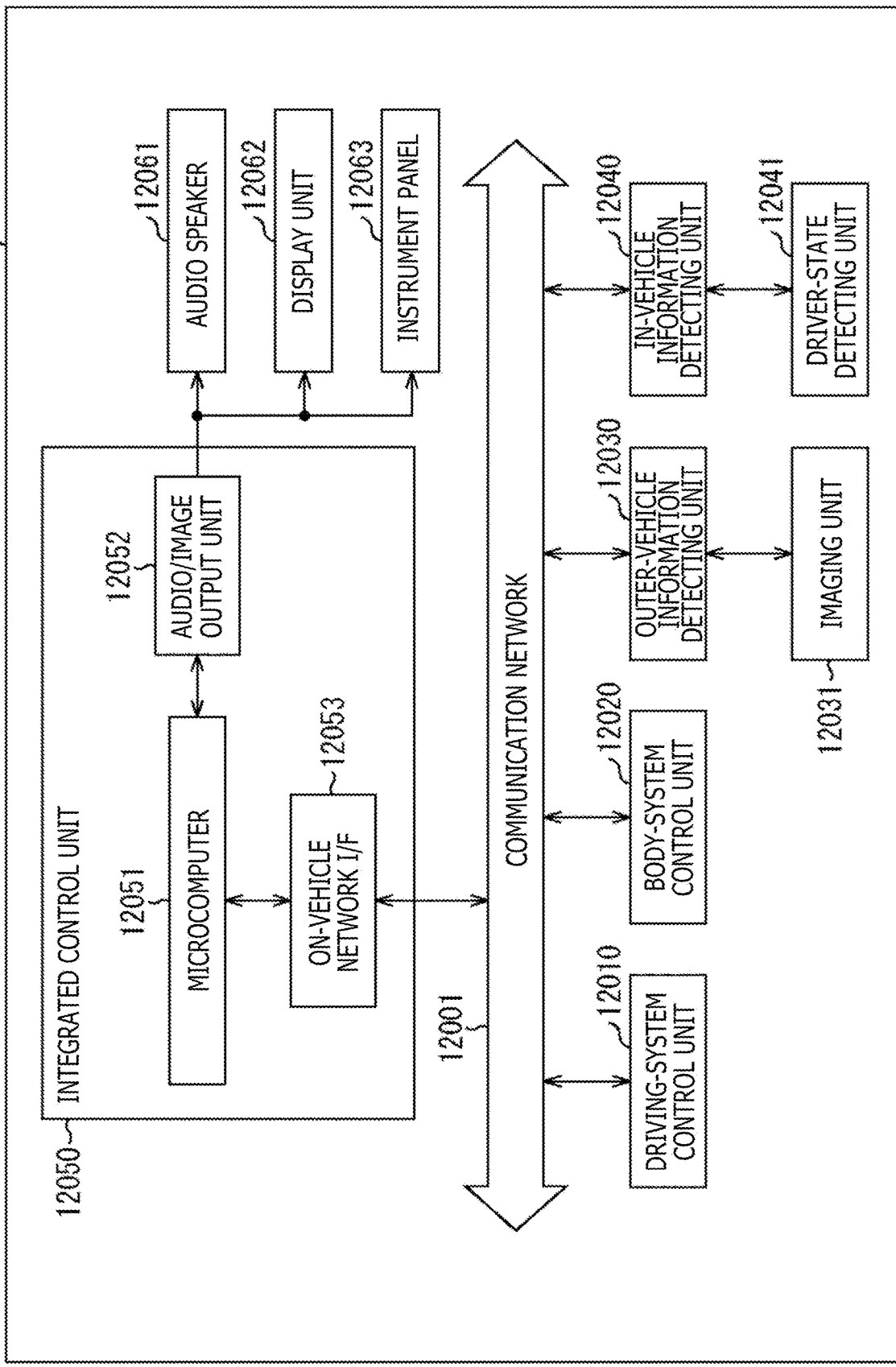
FIG. 20 is a block diagram schematically illustrating an exemplary configuration of a vehicle control system.

FIG. 20 is a block diagram schematically illustrating an exemplary configuration of a vehicle control system. The vehicle control system is an example of a mobile body control system to which the technology according to the present disclosure can be applied.

A vehicle control system 12000 includes a plurality of electronic control units connected via a communication network 12001. In the example illustrated in FIG. 20, the vehicle control system 12000 includes a driving-system control unit 12010, a body-system control unit 12020, an outer-vehicle information detecting unit 12030, an in-vehicle information detecting unit 12040, and an integrated control unit 12050. Further, a microcomputer 12051, an audio/image output unit 12052, and an on-vehicle network I/F (interface) 12053 are illustrated as a functional configuration of the integrated control unit 12050.

The driving-system control unit 12010 controls the operation of devices related to a driving system of a vehicle according to various programs. For example, the driving-system control unit 12010 functions as a control device for a driving force generating device, a driving force transmitting mechanism, a steering mechanism, a braking device, and the like. The driving force generating device generates a driving force of the vehicle. Examples of the driving force generating device include an internal combustion engine and a driving motor. The driving force transmitting mechanism transmits a driving force to wheels. The steering mechanism adjusts the steering angle of the vehicle. The braking device generates a braking force of the vehicle.

The body-system control unit 12020 controls the operation of various devices mounted a vehicle body according to various programs. For example, the body-system control unit 12020 functions as a control device for a keyless entry system, a smart key system, a power window device, or various lamps such as a head lamp, a back lamp, a brake lamp, a blinker, and a fog lamp. In this case, the body-system control unit 12020 can receive radio waves transmitted from a portable device substituted for a key or signals from various switches. The body-system control unit 12020 receives these radio waves or signals and controls a door lock device, the power window device, the lamps, and the like of the vehicle.

The outer-vehicle information detecting unit 12030 detects information outside the vehicle in which the vehicle control system 12000 is mounted. For example, an imaging unit 12031 is connected to the outer-vehicle information detecting unit 12030. The outer-vehicle information detecting unit 12030 causes the imaging unit 12031 to capture an image outside the vehicle and receives the captured image. On the basis of the received image, the outer-vehicle information detecting unit 12030 may perform processing of detecting an object such as a human, a vehicle, an obstacle, a sign, and a character on a road surface or may perform processing of detecting a distance to the object.

The imaging unit 12031 is an optical sensor that receives light and that outputs an electric signal corresponding to the amount of light received. The imaging unit 12031 is capable of outputting an electric signal as an image or as distance measurement information. Further, the light received by the imaging unit 12031 may be visible light or invisible light such as infrared light.

The in-vehicle information detecting unit 12040 detects information inside the vehicle. For example, a driver-state detecting unit 12041 is connected to the in-vehicle information detecting unit 12040. The driver-state detecting unit 12041 detects the state of the driver. The driver-state detecting unit 12041 includes, for example, a camera that images the driver. On the basis of detection information received from the driver-state detecting unit 12041, the in-vehicle information detecting unit 12040 may calculate the degree of fatigue or the degree of concentration of the driver or may determine whether the driver falls asleep.

The microcomputer 12051 is capable of calculating a control target value for the driving force generating device, the steering mechanism, or the braking device on the basis of the information regarding the inside or outside of the vehicle obtained by the outer-vehicle information detecting unit 12030 or the in-vehicle information detecting unit 12040, and outputting control instructions to the driving-system control unit 12010. For example, the microcomputer 12051 is capable of performing cooperative control to implement functions of an ADAS (Advanced Driver Assistance System). The ADAS includes vehicle collision avoidance or impact mitigation, follow-up traveling based on the distance between vehicles, traveling with a maintained speed, warning about collision of the vehicle, warning about deviation of the vehicle from the lane, and the like.

Further, the microcomputer 12051 is capable of performing cooperative control to perform self-driving, which makes the vehicle travel autonomously without the driver's operation, and the like by controlling the driving force generating device, the steering mechanism, the braking device, or the like on the basis of the information regarding the surroundings of the vehicle obtained by the outer-vehicle information detecting unit 12030 or the in-vehicle information detecting unit 12040.

Further, the microcomputer 12051 is capable of outputting control instructions to the body-system control unit 12020 on the basis of the information regarding the outside of the vehicle obtained by the outer-vehicle information detecting unit 12030. For example, the microcomputer 12051 is capable of performing cooperative control to prevent dazzle by controlling the head lamps according to the position of a preceding vehicle or an oncoming vehicle detected by the outer-vehicle information detecting unit 12030 and switching from high beams to low beams, for example.

The audio/image output unit 12052 transmits at least one of output signals of audio and images to output devices capable of visually or audibly notifying an occupant of the vehicle or the outside of the vehicle of information. In the example in FIG. 20, an audio speaker 12061, a display unit 12062, and an instrument panel 12063 are illustrated as the output devices. The display unit 12062 may include at least one of an on-board display and a head-up display, for example.

Figure 21:
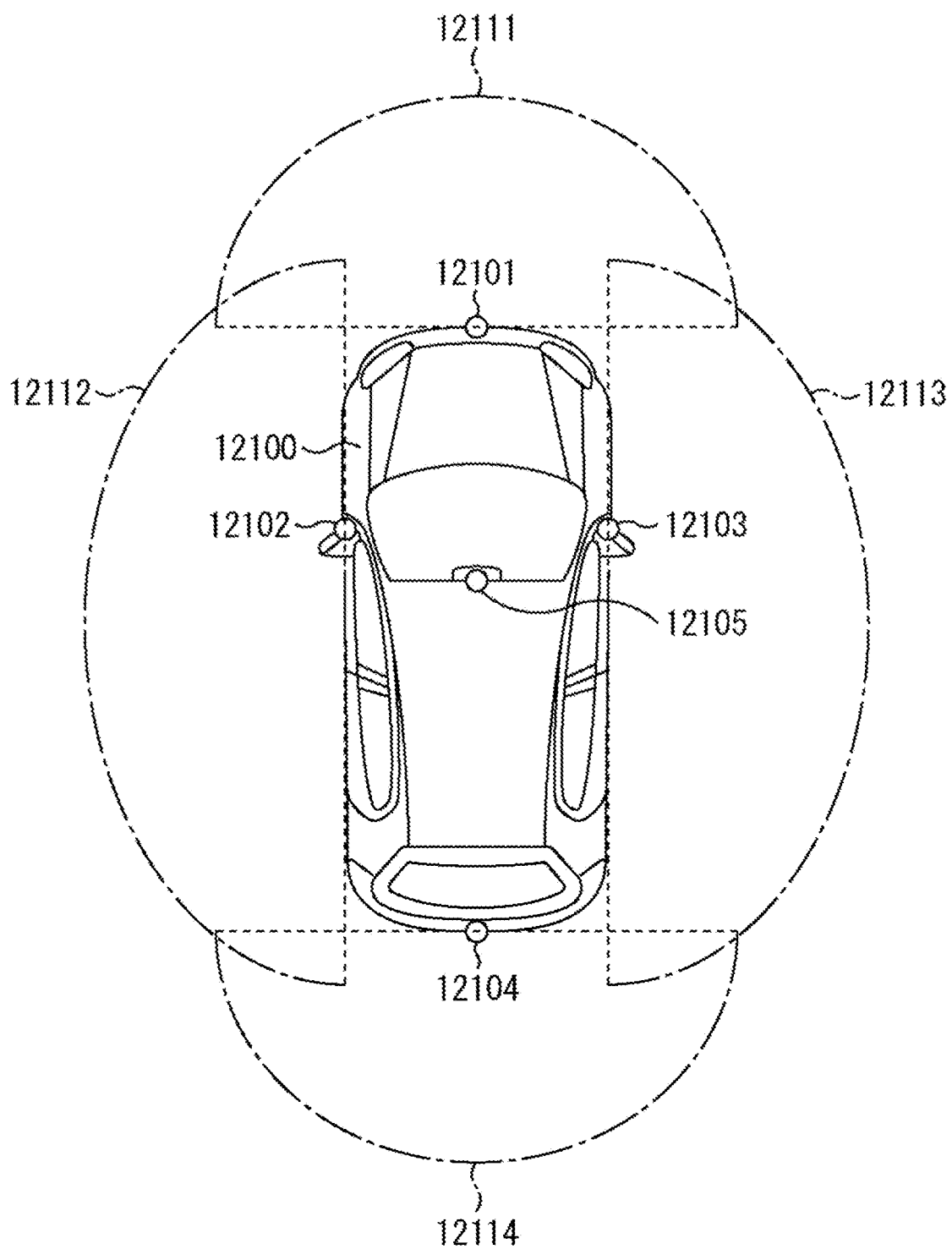
FIG. 21 is a diagram for describing an exemplary position where an imaging unit is mounted.

FIG. 21 is a diagram illustrating an exemplary position where the imaging unit 12031 is mounted.

In FIG. 21, the imaging unit 12031 includes imaging units 12101, 12102, 12103, 12104, and 12105.

For example, the imaging units 12101, 12102, 12103, 12104, and 12105 are mounted in respective positions of a vehicle 12100 such as a front nose, side mirrors, a rear bumper, a back door, and an upper portion of a windshield in the vehicle interior. The imaging unit 12101 mounted in the front nose and the imaging unit 12105 mounted in the upper portion of the windshield in the vehicle interior mainly obtain images of the front of the vehicle 12100. The imaging units 12102 and 12103 mounted in the side mirrors mainly obtain images of the sides of the vehicle 12100. The imaging unit 12104 mounted in the rear bumper or the back door mainly obtains an image of the back of the vehicle 12100. The imaging unit 12105 mounted in the upper portion of the windshield in the vehicle interior is mainly used to detect a preceding vehicle, a pedestrian, an obstacle, a traffic signal, a traffic sign, a lane, or the like.

It is noted that FIG. 21 illustrates an example of imaging ranges of the imaging units 12101 to 12104. An imaging range 12111 indicates an imaging range of the imaging unit 12101 mounted in the front nose. Imaging ranges 12112 and 12113 respectively indicate imaging ranges of the imaging units 12102 and 12103 mounted in the side mirrors. An imaging range 12114 indicates an imaging range of the imaging unit 12104 mounted in the rear bumper or the back door. It is possible to obtain an overhead image of the vehicle 12100 viewed from above by superimposing data of images captured by the imaging units 12101 to 12104, for example.

At least one of the imaging units 12101 to 12104 may have a function of obtaining distance information. For example, at least one of the imaging units 12101 to 12104 may be a stereo camera including a plurality of imaging devices or may be an imaging device including pixels for phase difference detection.

On the basis of the distance information obtained from the imaging units 12101 to 12104, for example, the microcomputer 12051 calculates a distance to each three-dimensional object within the imaging ranges 12111 to 12114 and a temporal change of the distance (relative speed with respect to the vehicle 12100). This allows the microcomputer 12051 to extract a three-dimensional object as a preceding vehicle in particular. The three-dimensional object extracted as the preceding vehicle is a closest object along a traveling path of the vehicle 12100 and is traveling at a predetermined speed (e.g., 0 km/h or higher) in substantially the same direction as the vehicle 12100. Further, the microcomputer 12051 is capable of presetting an inter-vehicle distance to the preceding vehicle that needs to be secured, and performing automatic brake control (including follow-up stop control), automatic acceleration control (including follow-up start control), and the like. In this manner, the microcomputer 12051 is capable of performing cooperative control to perform self-driving, which makes the vehicle travel autonomously without the driver's operation, and the like.

For example, the microcomputer 12051 is capable of classifying three-dimensional object data on the three-dimensional objects into a two-wheeled vehicle, a regular vehicle, a large vehicle, a pedestrian, and other three-dimensional objects such as utility poles on the basis of the distance information obtained by the imaging units 12101 to 12104, and extracting and using the classified three-dimensional objects to automatically avoid the obstacles. For example, the microcomputer 12051 distinguishes obstacles in the surroundings of the vehicle 12100 as an obstacle that can be visually recognized by the driver of the vehicle 12100 or an obstacle that is difficult to be visually recognized by the driver. Subsequently, the microcomputer 12051 determines a collision risk that indicates a risk of collision with each obstacle. In a situation where the collision risk is equal to or higher than a setting value and a collision may occur, the microcomputer 12051 is capable of outputting a warning to the driver through the audio speaker 12061 or the display unit 12062 or forcibly reducing the speed or performing avoidance steering through the driving-system control unit 12010 to provide driving support for collision avoidance.

At least one of the imaging units 12101 to 12104 may be an infrared camera for detecting infrared light. For example, the microcomputer 12051 is capable of determining whether a pedestrian exists in images captured by the imaging units 12101 to 12104 to recognize the pedestrian. This pedestrian recognition is performed by, for example, a procedure of extracting interest points in the images captured by the imaging units 12101 to 12104 serving as the infrared cameras and a procedure of performing pattern matching processing on the series of interest points indicating the outline of an object to determine whether the object is an pedestrian. In a case where the microcomputer 12051 determines that a pedestrian exists in the images captured by the imaging units 12101 to 12104 and recognizes the pedestrian, the audio/image output unit 12052 controls the display unit 12062 so as to superimpose and display a square outline for emphasis on the recognized pedestrian. Further, the audio/image output unit 12052 may control the display unit 12062 so as to display an icon or the like indicating a pedestrian in a desired position.

Hereinabove, description has been made with regard to an example of the vehicle control system to which the technology according to the present disclosure is applicable. The technology according to the present disclosure is applicable to, for example, the imaging unit 12031 and the driver-state detecting unit 12041 among the configurations described above. Specifically, for example, the CMOS image sensor 10 in FIG. 1 is applicable to the imaging unit 12031 and the driver-state detecting unit 12041. By applying the technology according to the present disclosure to the imaging unit 12031 or the driver-state detecting unit 12041, it is Possible to obtain a high-quality captured image with less noise. This improves accuracy of detection of information outside and inside the vehicle, for example.

It is noted that the embodiments of the technology according to the present disclosure are not limited to the above-described embodiments and various modifications can be made without departing from the gist of the technology according to the present disclosure.

<4-4. Exemplary Combination of Configurations>

Further, for example, the technology according to the present disclosure can also be configured as follows.

(1) An imaging device including:
a photoelectric conversion unit;
an electric-charge holding unit configured to hold an electric charge generated by the photoelectric conversion unit;
a semiconductor substrate in which the photoelectric conversion unit and the electric-charge holding unit are formed;
a wiring layer;
an insulation film layer;
a first light-shielding film; and
a second light-shielding film,
in which the insulation film layer, the first light-shielding film, and the wiring layer are stacked on a second surface of the semiconductor substrate in order from closest to the second surface, the second surface being opposite to a first surface of the semiconductor substrate, the first surface being at a light receiving side of the semiconductor substrate, and
the second light-shielding film includes
a first light-shielding portion arranged between the photoelectric conversion unit and the electric-charge holding unit and extending from the first surface of the semiconductor substrate to a middle of the semiconductor substrate,
a second light-shielding portion arranged between the photoelectric conversion unit and the electric-charge holding unit and penetrating the semiconductor substrate, and
a third light-shielding portion covering a part of the first surface of the semiconductor substrate.

(2) The imaging device according to (1), in which the first light-shielding portion and the second light-shielding portion are coupled to each other in a direction parallel to the first surface.

(3) The imaging device according to (2), in which side surfaces of the photoelectric conversion unit are surrounded by the first light-shielding portion and the second light-shielding portion.

(4) The imaging device according to (3),
in which the first light-shielding portion is at least arranged between the photoelectric conversion unit and a transfer gate portion configured to transfer the electric charge from the photoelectric conversion unit to the electric-charge holding unit, and
the second light-shielding portion is at least arranged between the photoelectric conversion unit and the electric-charge holding unit that are arranged in mutually different pixels.

(5) The imaging device according to any one of (1) to (4),
in which the insulation film layer includes two layers including a first insulation film and a second insulation film that are different from each other in composition, and
the first insulation film is arranged between the second surface of the semiconductor substrate and the second insulation film.

(6) The imaging device according to (5),
in which the first insulation film is an oxide film, and
the second insulation film is a nitride film or an oxynitride film.

(7) The imaging device according to (6), in which the insulation film layer further includes a third insulation film arranged between the second insulation film and the first light-shielding film and including an oxide film.

(8) The imaging device according to (7),
in which the first insulation film has a thickness of 10 nm or greater,
the second insulation film has a thickness of 50 nm or greater, and
the third insulation film has a thickness of 25 nm or greater.

(9) The imaging device according to (8),
in which the first insulation film has a thickness in a range of 10 to 20 nm,
the second insulation film has a thickness in a range of 50 to 100 nm, and
the third insulation film has a thickness in a range of 30 to 100 nm.

(10) The imaging device according to any one of (5) to (9), in which the second light-shielding portion penetrates the first insulation film and extends into the second insulation film.

(11) The imaging device according to any one of (1) to (9), in which the second light-shielding portion penetrates the insulation film layer and is coupled to the first light-shielding film.

(12) The imaging device according to any one of (1) to (11), in which the third light-shielding portion covers a region of the first surface of the semiconductor substrate, the region excluding a region from which light enters the photoelectric conversion unit.

(13) The imaging device according to any one of (1) to (12), in which the first light-shielding film entirely covers a surface of the photoelectric conversion unit, the surface being opposite to a light receiving surface of the photoelectric conversion unit.

(14) The imaging device according to any one of (1) to (13), in which a positive bias or a negative bias is applied to the second light-shielding portion.

(15) The imaging device according to any one of (1) to (14), in which the second light-shielding portion is greater in width in a direction parallel to the first surface than the first light-shielding portion.

(16) A method for manufacturing an imaging device, the method including:

a first step of forming a first trench and a second trench in respective predetermined positions on a first pattern between a photoelectric conversion unit and an electric-charge holding unit configured to hold an electric charge generated by the photoelectric conversion unit, the first pattern covering a first surface of a semiconductor substrate in which the photoelectric conversion unit and the electric-charge holding unit are formed, the first surface being at a light receiving side of the semiconductor substrate;

a second step of filling the first trench with a second pattern;

a third step of digging the second trench down to a middle of the semiconductor substrate;

a fourth step of, after removing the second pattern, digging down the first trench and the second trench until the second trench penetrates the semiconductor substrate and reaches an insulation film layer formed on a second surface of the semiconductor substrate opposite to the first surface of the semiconductor substrate;

a fifth step of forming a multi-layer film so as to cover the first surface of the semiconductor substrate, inner walls and a bottom of the first trench, and inner walls and a bottom of the second trench, the multi-layer film including a fixed electric charge film, an anti-reflection film, and an insulation film;

a sixth step of filling the first trench with a third pattern;

a seventh step of, while removing the third pattern, digging the second trench down until the second trench penetrates the multi-layer film and the insulation film layer and reaches a first light-shielding film stacked on the insulation film layer; and an eighth step of forming a second light-shielding film in the first trench and the second trench.

(17) The method for manufacturing an imaging device according to (16), in which the insulation film layer includes two layers including a first insulation film and a second insulation film that are different from each other in composition.

(18) The method for manufacturing an imaging device according to (17), in which in the fourth step, the second trench is caused to penetrate the semiconductor substrate and the first insulation film to the second insulation film.

(19) The method for manufacturing an imaging device according to (17), in which the insulation film layer includes a third insulation film arranged between the second insulation film and the first light-shielding film, the first insulation film and the third insulation film each include an oxide film, and the second insulation film includes a nitride film or an oxynitride film.

(20) The method for manufacturing an imaging device according to (19), the method further including:

before the first step, a ninth step of forming the second insulation film on a surface of the first insulation film, the surface being opposite to the second surface of the semiconductor substrate;

a tenth step of forming a third trench in a position for forming the second trench in the second insulation film, the third trench penetrating to the first insulation film; and an eleventh step of depositing the third insulation film on a surface of the second insulation film while filling the third trench with the third insulation film, in which in the seventh step, the third insulation film in the third trench is removed and the second trench is dug down to the first light-shielding film.

(21) A method for manufacturing an imaging device, the method including:

a first step of forming a first trench and a second trench in respective predetermined positions on a first pattern between a photoelectric conversion unit and an electric-charge holding unit configured to hold an electric charge generated by the photoelectric conversion unit, the first pattern covering a first surface of a semiconductor substrate in which the photoelectric conversion unit and the electric-charge holding unit are formed, the first surface being at a light receiving side of the semiconductor substrate;

a second step of filling the first trench with a second pattern;

a third step of digging the second trench down to a middle of the semiconductor substrate;

a fourth step of, after removing the second pattern, digging down the first trench and the second trench until the second trench penetrates the semiconductor substrate and reaches an insulation film layer formed on a second surface of the semiconductor substrate opposite to the first surface of the semiconductor substrate; and a fifth step of forming a light shielding film in the first trench and the second trench.

(22) An electronic device including:

an imaging device; and a signal processing unit configured to process a signal output from the imaging device, in which the imaging device includes a photoelectric conversion unit, an electric-charge holding unit configured to hold an electric charge generated by the photoelectric conversion unit, a semiconductor substrate in which the photoelectric conversion unit and the electric-charge holding unit are formed, a wiring layer, an insulation film layer, a first light-shielding film, and a second light-shielding film, the insulation film layer, the first light-shielding film, and the wiring layer are stacked on a second surface of the semiconductor substrate in order from closest to the second surface, the second surface being opposite to a first surface of the semiconductor substrate, the first surface being at a light receiving side of the semiconductor substrate, and the second light-shielding film includes a first light-shielding portion arranged between the photoelectric conversion unit and the electric-charge holding unit and extending from the first surface of the semiconductor substrate to a middle of the semiconductor substrate, a second light-shielding portion arranged between the photoelectric conversion unit and the electric-charge holding unit and penetrating the semiconductor substrate, and a third light-shielding portion covering a part of the first surface of the semiconductor substrate.

REFERENCE SIGNS LIST 10, 10a, 10b CMOS image sensor
11 Pixel array unit
51 Photodiode
53 P-type well layer
54 TRY gate
55-1 TX1 gate
55-2 TX2 gate
56 Electric-charge holding unit
57 TRG gate
58 Floating diffusion region
101 Semiconductor substrate
102 Insulation film layer
102A to 102C insulation film
103 Light shielding film
104 Wiring layer
105 Gate electrode
106 Multi-layer film
107 Light shielding film
107A Surface light-shielding portion
107B Non-penetrating light shielding portion
107C Penetrating light shielding portion
201 Hard mask
203, 204 Trench
205, 206 photoresist
207 Insulation film
208 Photoresist
222 Trench
300 Imaging apparatus
302 Solid-state imaging device
12000 Vehicle control system
12031 Imaging unit
12041 Driver-state detecting unit
12101 to 12105 Imaging unit

What is claimed is:

1. An imaging device, comprising:
a semiconductor substrate including a first surface and a second surface, the first surface being at a light receiving side of the semiconductor substrate, the second surface being opposite to the first surface;
a first photoelectric conversion unit and a second photoelectric conversion unit disposed in the semiconductor substrate;
an electric-charge holding unit disposed between the first photoelectric conversion unit and the second photoelectric conversion unit in a cross-sectional view;
a wiring layer disposed under the semiconductor substrate;
an insulation film layer disposed between the semiconductor substrate and the wiring layer;
a first light-shielding film disposed between the wiring layer and the insulation film; and
a second light-shielding film, the second light-shielding film including:
a first portion disposed between the first photoelectric conversion unit and the electric-charge holding unit, wherein the first portion extends from the first surface of the semiconductor substrate to the second surface of the semiconductor substrate in the cross-sectional view; and
a second portion disposed between the second photoelectric conversion unit and the electric-charge holding unit, wherein the second portion extends from the first surface of the semiconductor substrate to the second surface of the semiconductor substrate in the cross-sectional view, and wherein the second portion contacts the first light-shielding film.

2. The imaging device according to claim 1, wherein the second portion is longer than the first portion in a depth direction of the semiconductor substrate.

3. The imaging device according to claim 1, wherein the second light-shielding film further includes a third portion disposed above the electric-charge holding unit.

4. The imaging device according to claim 3, wherein the third portion contacts the first portion and the second portion.

5. The imaging device according to claim 1, wherein the insulation film layer includes a first insulation film and a second insulation film.

6. The imaging device according to claim 5, wherein the first insulation film is an oxide film.

7. The imaging device according to claim 5, wherein the second insulation film is a nitride film or an oxynitride film.

8. The imaging device according to claim 5, wherein the insulation film layer further includes a third insulation film.

9. The imaging device according to claim 8, wherein third insulation film is disposed between the second insulation film and the first light-shielding film.

10. The imaging device according to claim 8, wherein the first insulation film has a thickness of 10 nm or greater, the second insulation film has a thickness of 50 nm or greater, and the third insulation film has a thickness of 25 nm or greater.

11. The imaging device according to claim 10, wherein the thickness of the first insulation film has a range of 10 to 20 nm, the thickness of the second insulation film has a range of 50 to 100 nm, and the thickness of the third insulation film has a range of 30 to 100 nm.

12. The imaging device according to claim 1, wherein the first light-shielding film is disposed under the first photoelectric conversion unit and the second photoelectric conversion unit.

13. The imaging device according to claim 1, wherein a positive bias or a negative bias is applied to the second portion of the second light-shielding film.

14. The imaging device according to claim 1, further comprising:
a floating diffusion region, and wherein the electric-charge holding unit is different from the floating diffusion region.

15. The imaging device according to claim 1, wherein the first light-shielding film includes tungsten.

16. An electronic device, comprising:
an imaging device; and
a signal processing unit configured to process a signal output from the imaging device, wherein the imaging device includes:
a semiconductor substrate including a first surface and a second surface, the first surface being at a light receiving side of the semiconductor substrate, the second surface being opposite to the first surface;
a first photoelectric conversion unit and a second photoelectric conversion unit disposed in the semiconductor substrate;
an electric-charge holding unit disposed between the first photoelectric conversion unit and the second photoelectric conversion unit in a cross-sectional view;
a wiring layer disposed under the semiconductor substrate;

an insulation film layer disposed between the semiconductor substrate and the wiring layer;
a first light-shielding film disposed between the wiring layer and the insulation film; and
a second light-shielding film, the second light-shielding film including:
a first portion disposed between the first photoelectric conversion unit and the electric-charge holding unit, wherein the first portion extends from the first surface of the semiconductor substrate to the second surface of the semiconductor substrate in the cross-sectional view; and
a second portion disposed between the second photoelectric conversion unit and the electric-charge holding unit, wherein the second portion extends from the first surface of the semiconductor substrate to the second surface of the semiconductor substrate in the cross-sectional view, and wherein the second portion contacts the first light-shielding film.

17. The electronic device according to claim 16, wherein the insulation film layer includes a first insulation film and a second insulation film.

18. The electronic device according to claim 17, wherein the first insulation film is an oxide film.

19. The electronic device according to claim 17, wherein the second insulation film is a nitride film or an oxynitride film.

20. The electronic device according to claim 17, wherein the insulation film layer further includes a third insulation film.

* * * * *